(12) United States Patent
Kim et al.

(10) Patent No.: US 8,294,839 B2
(45) Date of Patent: Oct. 23, 2012

(54) THIN FILM TRANSISTOR ARRAY PANEL FOR LIQUID CRYSTAL DISPLAY AND METHOD OF MANUFACTURING THE SAME

(75) Inventors: Dong-Gyu Kim, Sunwon (KR); Jun-Ho Song, Suwon (KR); Jong-Woong Chang, Suwon (KR); Jae-Ho Choi, Seoul (KR); Byoung-Sun Na, Suwon (KR); Young-Bae Park, Yongin (KR); Sung-Wook Huh, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/162,515

(22) Filed: Jun. 16, 2011

(65) Prior Publication Data

US 2011/0248274 A1 Oct. 13, 2011

Related U.S. Application Data

(60) Continuation of application No. 12/906,781, filed on Oct. 18, 2010, now Pat. No. 7,978,276, which is a continuation of application No. 11/938,011, filed on Nov. 9, 2007, now Pat. No. 7,839,460, which is a continuation of application No. 10/626,617, filed on Jul. 25, 2003, now Pat. No. 6,900,854, which is a division of application No. 09/450,333, filed on Nov. 29, 1999, now Pat. No. 6,798,442.

(30) Foreign Application Priority Data

Nov. 26, 1998 (KR) ..................................... 98-50877
Nov. 18, 1999 (KR) ..................................... 99-51376

(51) Int. Cl.
G02F 1/136 (2006.01)
(52) U.S. Cl. ......................................................... 349/43
(58) Field of Classification Search ..................... 349/43
See application file for complete search history.

(56) References Cited

U.S. PATENT DOCUMENTS

| 5,883,682 | A | 3/1999 | Kim et al. | |
|---|---|---|---|---|
| 5,982,467 | A * | 11/1999 | Lee | ................. 349/138 |
| 6,025,892 | A | 2/2000 | Kawai et al. | |
| 6,038,003 | A | 3/2000 | Kim | |
| 6,091,466 | A | 7/2000 | Kim et al. | |
| 6,414,730 | B1 | 7/2002 | Akamatsu et al. | |
| 2006/0012727 | A1 | 1/2006 | Ono et al. | |

FOREIGN PATENT DOCUMENTS

| JP | 02-072329 | | 3/1990 |
|---|---|---|---|
| JP | 05-066419 | | 3/1993 |
| JP | 06-035001 | | 2/1994 |
| JP | 06-051348 | A | 2/1994 |
| JP | 06-051349 | A | 2/1994 |

(Continued)

*Primary Examiner* — James Dudek
(74) *Attorney, Agent, or Firm* — Innovation Counsel LLP

(57) ABSTRACT

A method for manufacturing a thin film transistor array panel is disclosed. A gate wiring pattern is formed on an insulating substrate. A gate insulating layer is formed on the gate wiring pattern. A semiconductor pattern is formed on the gate insulating layer. A transparent conductive layer is formed on the gate insulating layer. The transparent conductive layer is patterned to form a pixel electrode. An opening is formed at a circumference of the pixel electrode. The opening minimizes misalignment during the manufacturing process and prevents shorts between a data line and the pixel electrode.

14 Claims, 31 Drawing Sheets

FOREIGN PATENT DOCUMENTS

| | | |
|---|---|---|
| JP | 06-160905 A | 6/1994 |
| JP | 06-310533 A | 11/1994 |
| JP | 07-098462 | 4/1995 |
| JP | 07-234416 A | 9/1995 |
| JP | 08-334781 A | 12/1996 |
| JP | 09-017798 A | 1/1997 |
| JP | 09-230373 A | 9/1997 |
| JP | 09-230376 A | 9/1997 |
| JP | 09-258244 A | 10/1997 |
| JP | 09-325366 A | 12/1997 |
| JP | 10-010583 A | 1/1998 |
| JP | 10-253985 | 9/1998 |
| JP | 10-293326 A | 11/1998 |
| JP | 10-305369 | 11/1998 |
| JP | 2000-098427 | 4/2000 |
| KR | 1997-0071090 | 11/1997 |
| KR | 1998-059092 | 10/1998 |
| KR | 1999-0066402 | 8/1999 |
| KR | 1999-0079883 | 11/1999 |

* cited by examiner

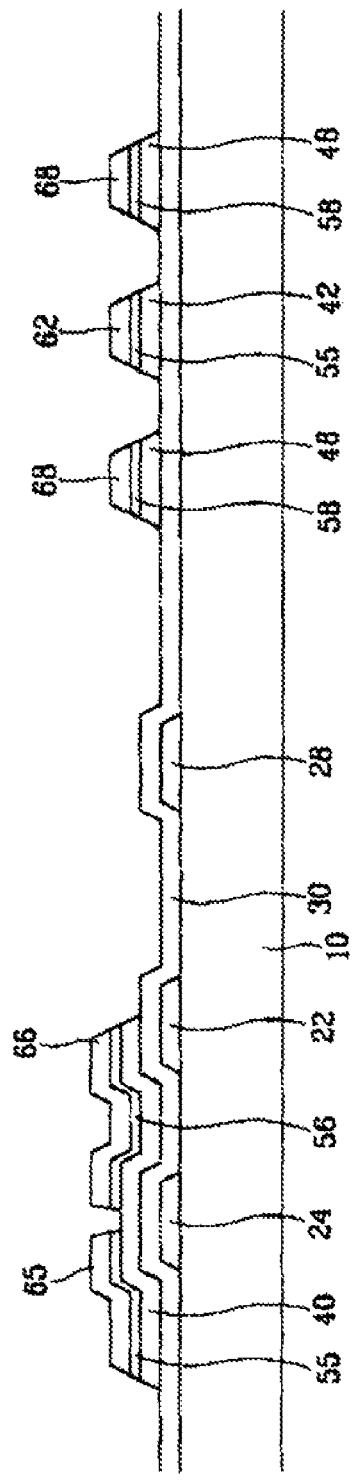
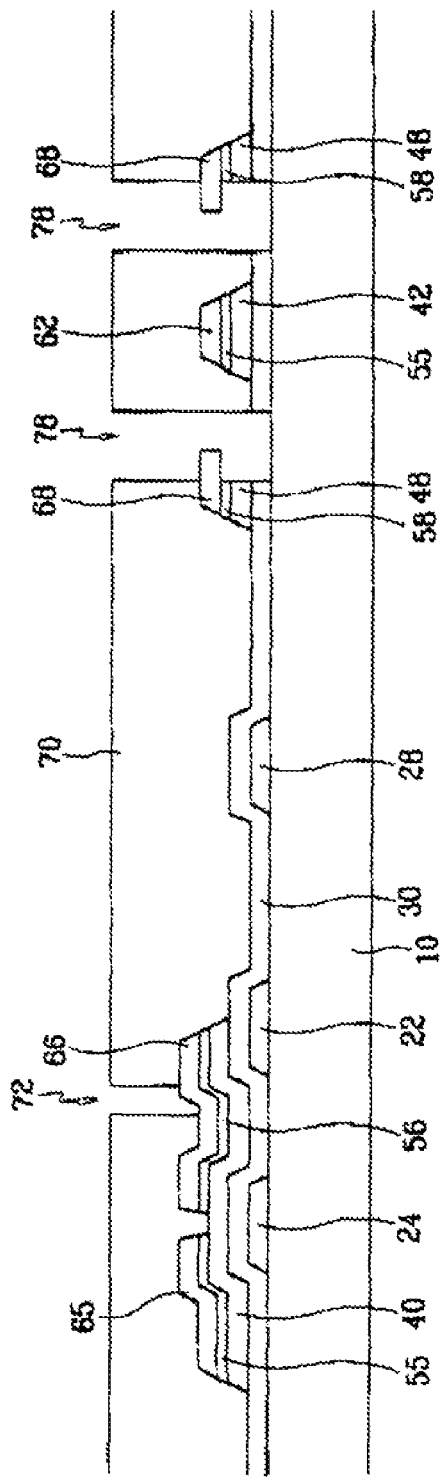
FIG. 32C
FIG. 32D

THIN FILM TRANSISTOR ARRAY PANEL FOR LIQUID CRYSTAL DISPLAY AND METHOD OF MANUFACTURING THE SAME

CROSS REFERENCE TO PRIOR APPLICATIONS

This application is a Continuation Application of U.S. patent application Ser. No. 12/906,781 filed Oct. 18, 2010 now U.S. Pat. No. 7,978,276, which is a Continuation Application of application Ser. No. 11/938,011 filed on Nov. 9, 2007, and issued as U.S. Pat. No. 7,839,460, which is a Continuation Application of application Ser. No. 10/626,617 filed on Jul. 25, 2003, and issued as U.S. Pat. No. 6,900,854, which is a Divisional Application of application Ser. No. 09/450,333 filed on Nov. 29, 1999 and issued as U.S. Pat. No. 6,798,442, which claims priority to and the benefit of Korean Patent Application No. 98-50877 filed on Nov. 26, 1998 and Korean Patent Application No. 99-51376 filed on Nov. 18, 1999, the entire disclosures of which are incorporated herein by reference.

BACKGROUND OF THE INVENTION (a) Field of the Invention

The present invention relates to a thin film transistor array panel for a liquid crystal display and a method of manufacturing the same.

(b) Description of the Related Art

Liquid crystal display (LCDs) are one of the most widely used flat panel display (FPD) configurations. The liquid crystal display has two panels having electrodes for generating an electric field and a liquid crystal layer interposed between the two panels. The transmittance of incident light is controlled by the intensity of the electric field applied to the liquid crystal layer.

The typical liquid crystal display uses a thin film transistor as a switching element. Data lines and gate lines, which cross each other to define pixels in a matrix array, are formed on the panel on which the thin film transistors are disposed. Further, a pixel electrode is formed in each pixel.

However, in the process of manufacturing the panels for the liquid crystal display, if a conductive material remains on an unintended portion of the panel, in particular between adjacent pixel electrodes or between the pixel electrodes and the data lines, a pixel defect occurs in which the pixels remain in a white state even when the same are controlled to an OFF state. This is a result of shorting of the pixel electrodes with the data lines or adjacent pixel electrodes.

Also, during the operation of the liquid crystal display, after a pixel electrode receives an image signal, which is transmitted via a corresponding data line through the thin film transistor within the same pixel as the pixel electrode, the pixel electrode is then floated before receiving a subsequent image signal. However, the data line continuously transmits image signals to other pixel columns. Accordingly, a voltage of the image signals distorts a potential of the pixel electrode which is in a floating state. This results in an overall reduction in picture quality of the LCD. Such a problem worsens with increases in a coupling capacitance generated between the data lines and the pixel electrodes.

Furthermore, in the LCD panel manufacturing process, because the pixel electrodes and the data lines are formed through different photolithography processes, if there occurs mask misalignment, the coupling capacitance between the pixel electrodes and the data lines is varied. In particular, in case of using a stepper as an exposure device to conduct exposure in units of blocks, the degree of misalignment is different between the blocks such that stitches are generated, resulting in a difference of brightness between the blocks. This stitch defect is particularly severe in column or dot inversions drive type LCDs.

SUMMARY OF THE INVENTION

It is an object of the present invention to reduce pixel defects by preventing shorts between pixel electrodes and data lines by performing a conductive reaming process in a LCD manufacturing process.

It is another object of the present invention to minimize misalignment generated in the LCD manufacturing process.

These and other objects are provided, according to the present invention, by forming an opening at a circumference of a pixel electrode, or an align pattern on both sides of a data line when forming the data line.

According to the present invention, a gate wire including a gate line, and gate electrodes connected to the gate line are formed in the horizontal direction on a insulating substrate. A gate insulating layer covers the gate wire, and a semiconductor pattern made of semiconductor is formed on the gate insulating layer of the gate electrode. A data wire including a data line defining a pixel by intersecting the gate line, and a source electrode and a drain electrode formed on the semiconductor pattern and separated from each other on the gate electrode are formed in the vertical direction on the gate insulating layer. A passivation layer covering the data wire has a contact hole exposing the drain electrode and an opening at the circumference of the pixel. The pixel electrode connected to the drain electrode through the contact hole is formed in the pixel on the passivation layer.

Here, the opening may be extended into the gate insulating layer, and it is possible that the gate line has a first gate line and a second gate line, and a gate connecting portion interconnecting the first and second gate lines.

In another embodiment according to the present invention, the pixel electrode may be directly located on/under the data wire. Here, it is preferable that the opening is formed when etching the gate insulating layer to form the contact hole exposing a gate pad connected to the gate line, and a wet etch process is executed to remove a remaining conductive material such as indium tin oxide (ITO) for the pixel electrode. On the other hand, the remaining conductive material for the pixel electrode may be removed before etching the gate insulating layer.

Furthermore, in another embodiment according to the present invention, a gate line is formed in the horizontal direction on the insulating substrate, and a gate insulating layer covers the gate line. A semiconductor pattern is formed on the gate insulating layer. Formed on the gate insulating layer are a data wire including a data line formed in the vertical direction, a source electrode connected to the data line on the semiconductor pattern, and a drain electrode opposite the source electrode with respect to the gate electrode formed on the semiconductor pattern; and an align pattern located at both sides of the date line are formed on the gate insulating layer. A passivation layer covers the data line, the align pattern, the drain electrode, and the source electrode, and has a contact hole exposing the drain electrode A pixel electrode is formed on the passivation layer and connected to the drain electrode through the contact hole.

Furthermore, in another embodiment according to the present invention, a gate line is formed in the horizontal direction on the insulating substrate, and a gate insulating layer covers the gate line. A semiconductor pattern is formed on the gate insulating layer. Formed on the gate insulating layer are a data wire including a data line formed in the vertical direction, a source electrode connected to the data line on the semiconductor pattern, and a drain electrode opposite the source with respective to the gate electrode formed on the semiconductor pattern; and an align pattern located on both sides of the data line. A pixel electrode overlapping and connected to the drain electrode and the align pattern is also formed on the gate insulating layer. A passivation layer is formed on the pixel electrode.

At this time, ohmic contact layers may be formed between the source electrode and the semiconductor pattern, and between the drain electrode and the semiconductor pattern, and the passivation layer and the gate insulating layer may have an opening exposing the insulating substrate between the align pattern and the data line.

In a manufacturing method of a thin film transistor array panel for a liquid crystal display according to the present invention, a gate line is formed on an insulating substrate, and a gate insulating layer and a semiconductor layer are deposited thereon. The semiconductor layer is patterned to form a semiconductor pattern. A data wire including a data line, a source electrode and a drain electrode, and an align pattern are formed on the gate insulating layer. A passivation layer is deposited and patterned to form a contact hole exposing the drain electrode and an opening between the data line and the align pattern, and a pixel electrode is formed.

In another manufacturing method of a thin film transistor array panel for a liquid crystal display according to the present invention, a gate line is formed on an insulating substrate, and a gate insulating layer and a semiconductor layer are deposited thereon. The semiconductor layer is patterned to form a semiconductor pattern A a data wire including a data line, a source electrode and a drain electrode, and a align pattern are formed on the gate insulating layer. A pixel electrode connected to the drain electrode is formed on the gate insulating layer. A passivation layer is deposited and patterned to form an opening between the data line and the align pattern. Here, the step of etching the data line and the align pattern, which are exposed through the opening, may be added.

Furthermore, in another embodiment according to the present invention, a gate wire including a gate line extended in the horizontal direction, and a gate electrode connected to the gate line is formed on an insulating layer. A gate insulating layer covers the gate wire, and a semiconductor pattern is formed on the gate insulating layer. A data wire including a data line extended in the vertical direction, a source electrode, and a drain electrode separated from the source electrode and opposite the source electrode with respect to the gate electrode is formed on the semiconductor pattern. An align pattern located on both sides of the data line is formed on the semiconductor pattern, and a passivation layer pattern having a contact hole exposing the drain electrode and an opening between the data line and the align pattern covers the data wire and the align pattern. A pixel electrode connected to the drain electrode via the contact hole is formed opposite the drain electrode with respect to the passivation layer.

At this time, it is preferable that portions of the pixel electrode and the align pattern overlapping each other, and a distance between the data line and a boundary of the pixel electrode adjacent to the data line is equal to or greater than a distance between the data line and a boundary of the align pattern adjacent to the data line. A portion of the align pattern may be exposed through the opening, and the pixel electrode may be extended on the align pattern and connected to the align pattern. The opening may be extended to the semiconductor pattern and the gate insulating layer, and the insulating substrate may be exposed through the opening. It is preferable that the semiconductor pattern and the gate insulating layer are under-cut under the align pattern adjacent to the data line.

Repair lines overlapping a portion of the data line and both end portions of the align patterns may be added on the same layer as the gate wire. A supplementary data line of which both end portions are connected to the data line, intersecting the gate line, may be formed on the same layer as the data wire. A supplementary data line of which both end portions overlap the data line and intersect the gate line may be formed on the same layer as the pixel electrode.

BRIEF DESCRIPTION OF THE DRAWINGS

The accompanying drawings, which are incorporated in and constitute a part of the specification, illustrate an embodiment of the invention, and, together with the description, serve to explain the principle of the invention.

FIGS. 32A to 32D are cross-sectional views of a manufacturing method of a thin film transistor array panel according to the eighth embodiment of the present invention.

DETAILED DESCRIPTION OF THE PREFERRED EMBODIMENTS

Figure 1:
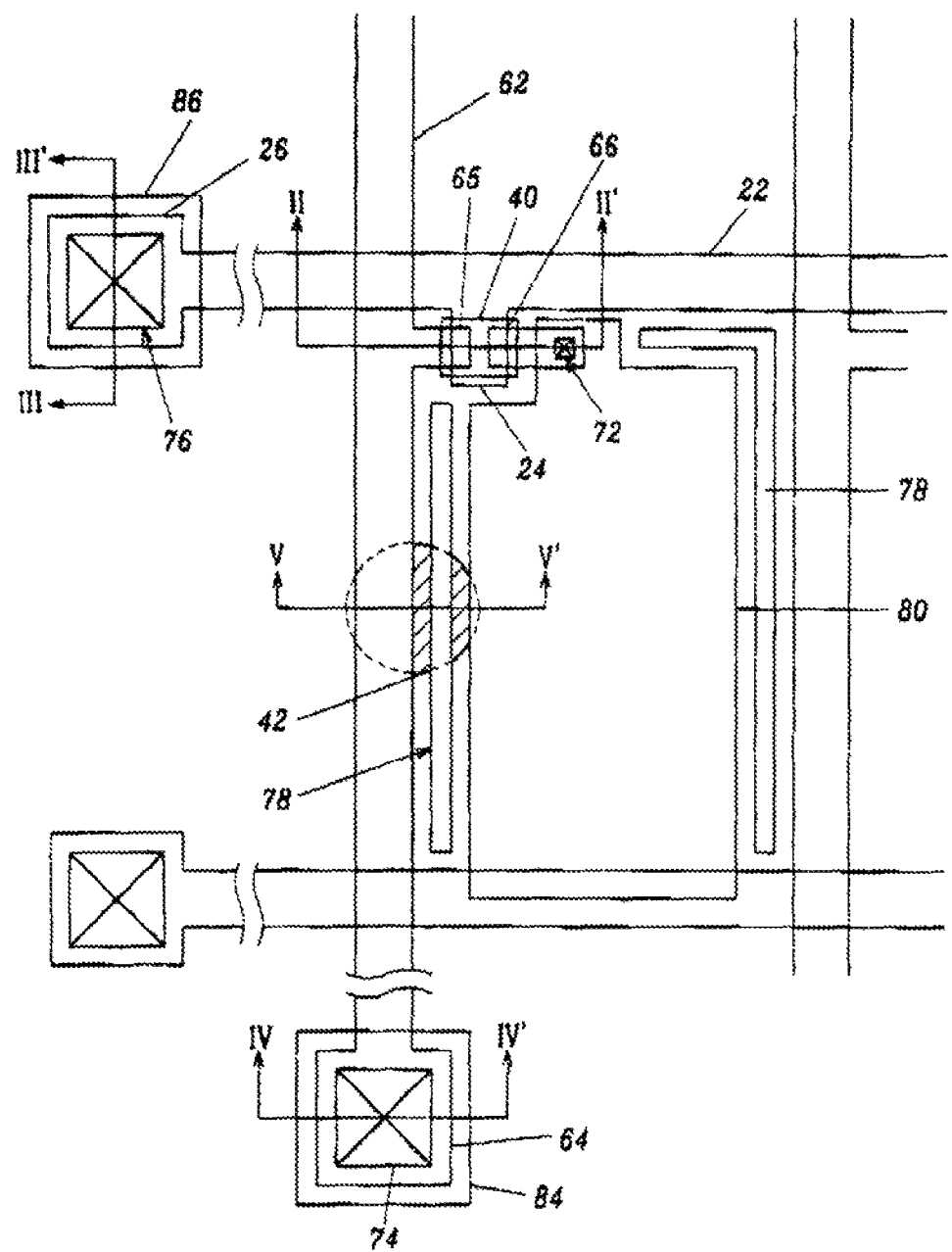
FIG. 1 is a layout view of a thin film transistor array panel for a liquid crystal display according to a first embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

Figure 2:
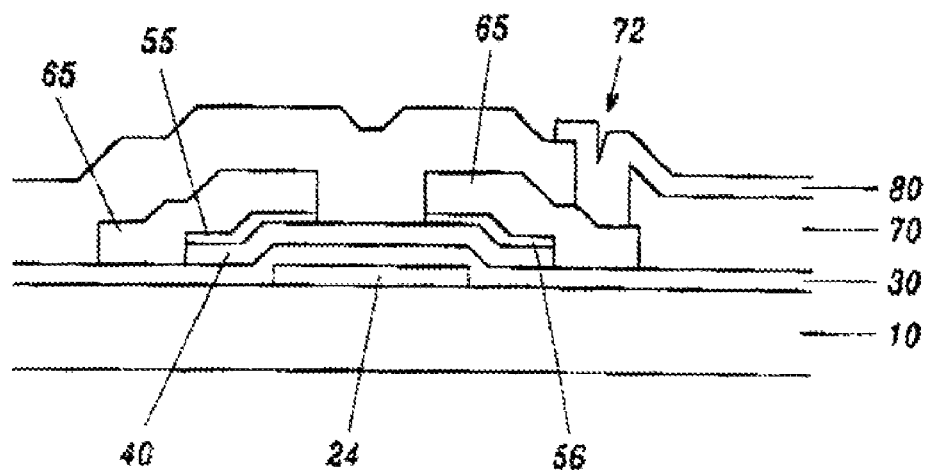
FIG. 2 is a cross-sectional view of a thin film transistor taken along line II-IP of FIG. 1.
Figure 3:
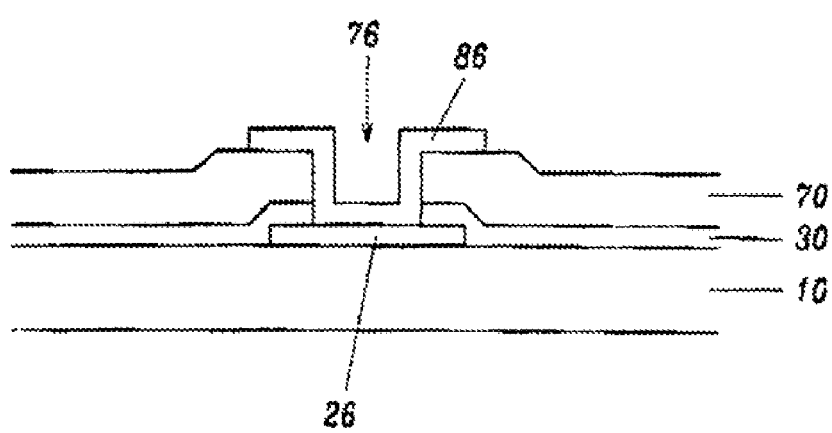
FIG. 3 is a cross-sectional view of a gate pad taken along line III-III' of FIG. 1.
Figure 4:
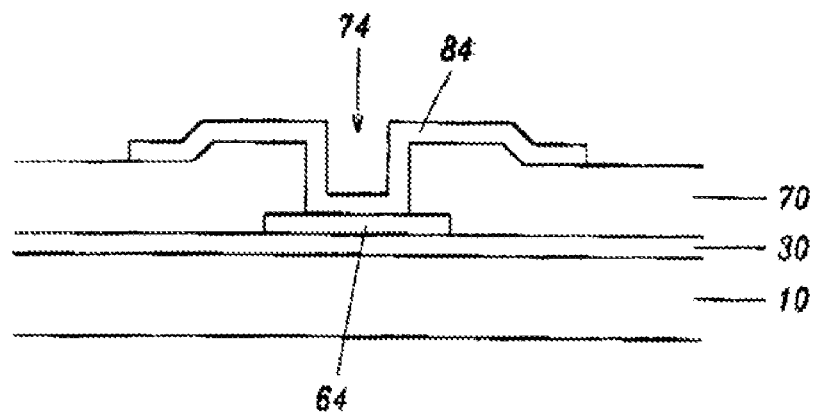
FIG. 4 is a cross-sectional view of a data pad taken along line IV-IV' of FIG. 1.
Figure 5:
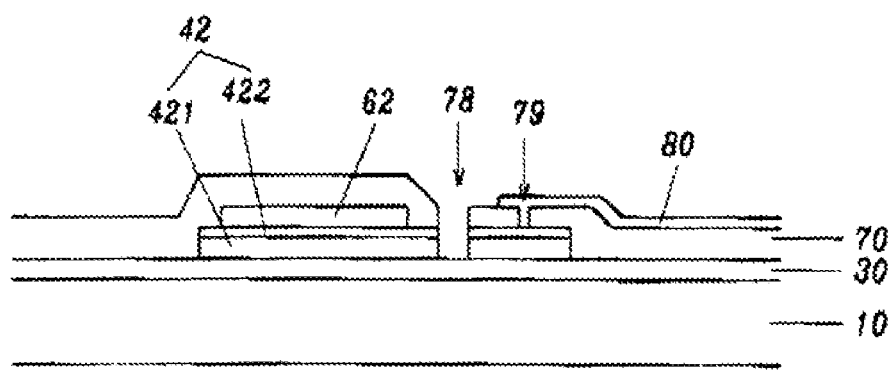
FIG. 5 is a cross-sectional view taken along line V-V' of FIG. 1.

FIG. 1 is a layout view of a thin film transistor array panel for a liquid crystal display according to a first embodiment of the present invention, FIG. 2 is a cross-sectional view of a thin film transistor taken along line II-II' of FIG. 1, FIG. 3 is a cross-sectional view of a gate pad taken along line III-III' of FIG. 1, FIG. 4 is a cross-sectional view of a data pad taken along line IV-IV' of FIG. 1, and FIG. 5 is a cross-sectional view taken along line V-V' of FIG. 1.

As shown in FIGS. 1 to 5, a gate line (or scanning signal line) 22 extending in the horizontal direction is formed on an insulating substrate 10; a gate pad 26 is formed connected to an end of the gate line 22, the gate pad 26 transmitting a scanning signal from an external circuit to the gate line 22; and a gate electrode 24, which is part of a thin film transistor, is formed branched from the gate line 22. Also, a gate insulating layer 30 of silicon-nitride (SiNx) is formed on the gate wire parts 22, 24, and 26 and covers the same.

A semiconductor layer 40 made of hydrogenated amorphous silicon (a-si:H) is formed on the gate insulating layer 30 opposite the gate electrode 21, a data line 62 is formed on the gate insulating layer 30 and extends in the longitudinal direction, and a data pad 64 on the gate insulating layer 30 is connected to the data line 62. A source electrode 65 is extended from the data line 62 and overlaps the one side of the gate electrode 24, and a drain electrode 66 is located opposite to the source electrode 65 with respect to the gate electrode 24, and overlaps the other side of the gate electrode 24.

Ohmic contact layers 55 and 56, made of hydrogenated amorphous silicon doped with N-type impurities, are respectively formed between the source electrode 65 and the semiconductor layer 40 and between the drain electrode 66 and the semiconductor layer 40. The ohmic contact layers 55 and 56 reduce contact resistivity between these elements.

A passivation layer 70 covers the data wire 62, 64, 65, and 66, and the semiconductor layer 40. The passivation layer 70 has contact holes 72 and 74 exposing the drain electrode 66 and the data pad 64, respectively, and the passivation layer 70 and the gate insulating 30 has a contact hole 76 exposing the gate pad 22. A pixel electrode 80 connected to the drain electrode 66 through the contact hole 72 is formed on the passivation layer 70 in a pixel defined by the gate line 22 and the data line 62. Furthermore, supplementary pad patterns 86 and 84, which are respectively connected to the gate pad 26 and the data pad 64 through the contact holes 76 and 74, are formed on the passivation layer 70.

As shown in FIGS. 1 to 5, an opening 78, from which the passivation layer 70 or the gate insulating layer 30 are removed, is formed in the passivation layer 70 between the gate line 22 and the pixel electrode 80 or the data line 62 and the pixel electrode 80. In the case where remaining conductive material 42, realized through an amorphous silicon layer 421 and a doped amorphous silicon layer 422, remains between the data line 62 and the pixel electrode 80, the opening 78 is formed in a state where both the passivation layer 70 and the remaining conductive material 42 are removed therefrom. In this case, because the remaining conductive material 42 contacting the data line 62 is disconnected between the data line 62 and the pixel electrode 80, the pixel electrode 80 and the data line 62 are electrically disconnected from each other, while the remaining conductive material 42 and the pixel electrode 80 are connected through a space 79 in the passivation layer 70.

A manufacturing method of a thin film transistor array panel according to the first embodiment of the present invention will now be described with reference to FIGS. 6A to 6E and FIGS. 1 to 5.

FIGS. 6A to 6E are cross-sectional views of a manufacturing method of a thin film transistor array panel according to the first embodiment of the present invention, including a step of forming an opening to remove remaining conductive material when patterning a passivation layer.

Figure 6A:
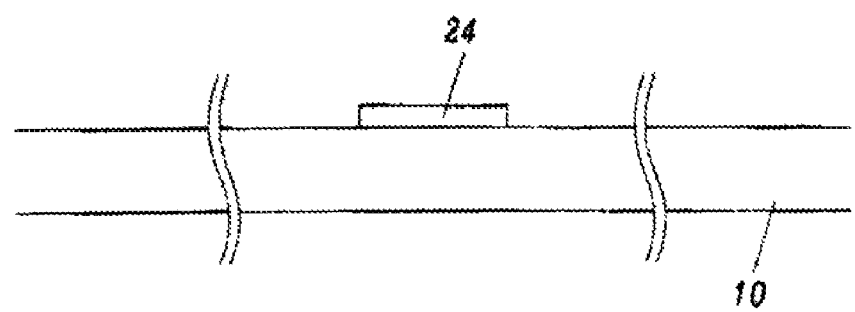
FIGS. 6A to 6E are cross-sectional views of a manufacturing method of a thin film transistor array panel according to the first embodiment of the present invention.
Figure 6B:
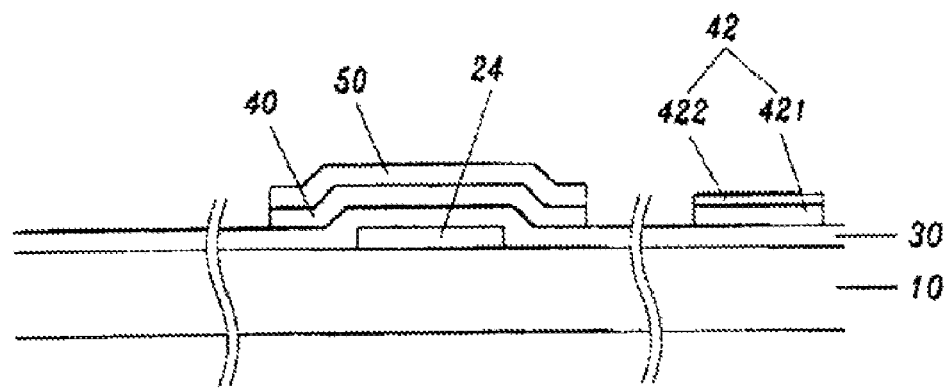

First, as shown in FIG. 6A, a gate conductor layer is deposited on a substrate 10, and patterned to form a gate wire including a gate line 22, a gate pad 26, a gate electrode 24. Next, as shown in FIG. 6B, a gate insulating layer 30 is formed on the gate wire, and amorphous silicon and doped amorphous silicon are sequentially deposited and patterned to form a semiconductor layer 40 and a doped amorphous silicon layer 50. In this step, a remaining conductive material layer 42 containing a semiconductor may remain on unintended portions.

Figure 6C:
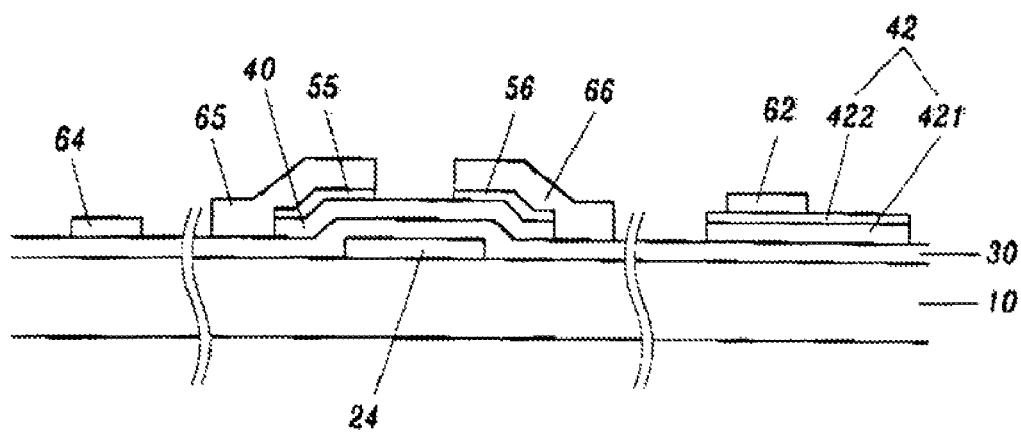

Subsequently, as shown in FIG. 6C, a conductor layer such as data metal is deposited and patterned to form a data line 62, a data pad 64, a source electrode 65, and a drain electrode 66. Next, the amorphous silicon layer 50, which is not covered by the source and the drain electrodes 65 and 66, is etched to form ohmic contact layers 55 and 56. In this step, a portion of the data metal may remain.

Figure 6D:
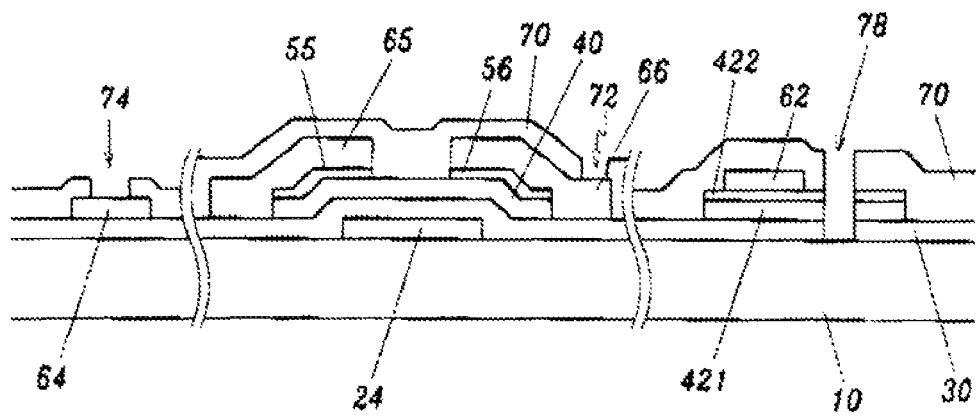

Next, as shown in FIG. 6D, a passivation layer 70 is deposited and patterned to form contact holes 72, 74, and 76 respectively exposing the drain electrode 66, the data pad 64, and the gate pad 26 by etching the passivation layer 70 and the gate insulating layer 30 at the same time. In this step, an opening 78 is formed by simultaneously etching the passivation layer 70, the gate insulating layer 30 or the remaining conductive material 42, which includes semiconductor material 421 and 422, around peripheries of the data line 62. At this time, it is desirable that an etch selectivity between the passivation layer 70 and the remaining conductive layer 42, and/or the gate insulating layer 30 and the remaining conductive layer 42 is small, or that dry etching at a high etch rate is performed while suitably adjusting etching gas and an etching time such that the remaining conductive layer 42 is sufficiently removed.

Figure 6E:
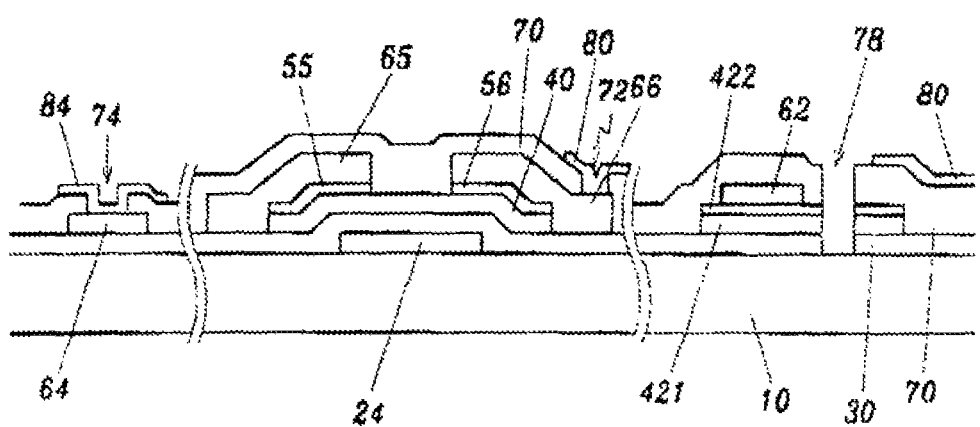

Next, as shown in FIG. 6E, an ITO layer is deposited and etched to form a pixel electrode 80 connected to the drain electrode 66 through the contact hole 72, a supplementary gate pad 86 and a supplementary data pad 84 respectively connected to the gate pad 26 and the data pad through the contact holes 76 and 74.

Next, a manufacturing method of a thin film transistor array panel according to the first embodiment of the present invention, including the step of forming an opening to remove remaining conductive material when patterning a gate insulating layer to expose a gate pad after forming a semiconductor layer, will now be described with reference to FIGS. 7A to 7D.

First, as shown in FIGS. 6A to 6B, a gate conductor layer is deposited on a substrate 10, and patterned to a gate wire including a gate line 22, a gate pad 26, a gate electrode 24. Next, a gate insulating layer 30 is formed on the gate wire, and amorphous silicon and doped amorphous silicon are sequentially deposited and patterned to form a semiconductor layer 40 and a doped amorphous silicon layer 50.

Figure 7A:
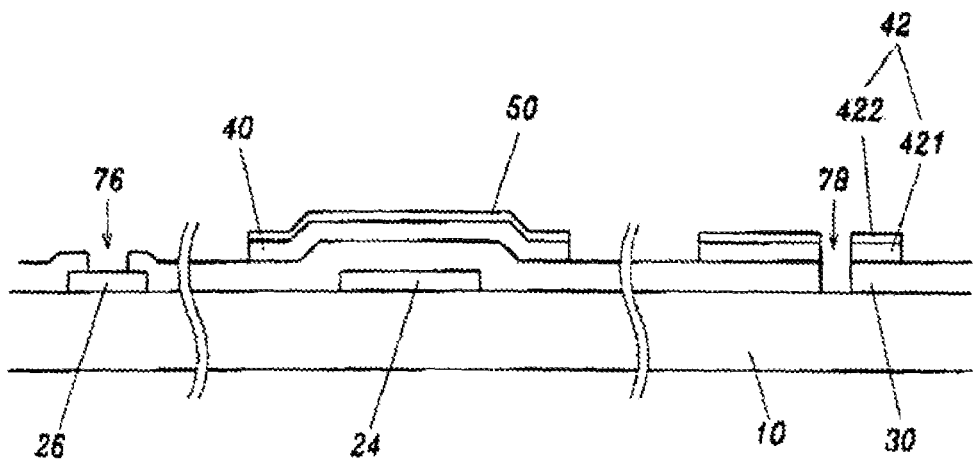
FIGS. 7A to 7D are cross-sectional views of a manufacturing method of a thin film transistor array panel according to the first embodiment of the present invention, including a step of forming an opening when exposing a gate pad.

Subsequently, as shown in FIG. 7A, the gate insulating layer 30 is patterned to form a contact hole 76 exposing the gate pad 26. In this step, an opening 78 is formed in the vertical direction between portions at which a data line 62 and a pixel electrode 80 will be formed. At this time, it is desirable that the opening 78 is formed under conditions in which an etch selectivity between the gate insulating layer 30 and a remaining conductive layer 42 is small, or in which an etch rate of remaining material is high.

Figure 7B:
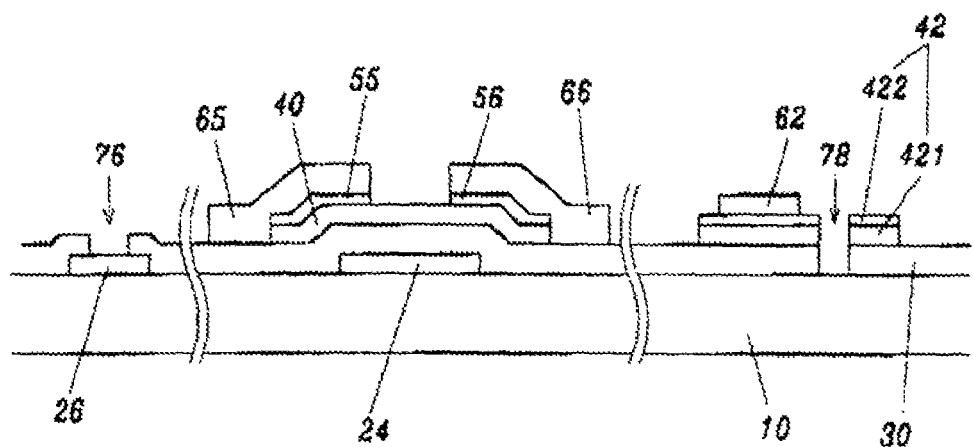

Next, as shown in FIG. 7B, a conductor layer such as data metal is deposited and patterned to form the data line 62, a data pad 64, a source electrode 65, and a drain electrode 66. Next, the amorphous silicon layer 50, which is not covered by the source and the drain electrodes 65 and 66, is etched to form ohmic contact layers 55 and 56.

Figure 7C:
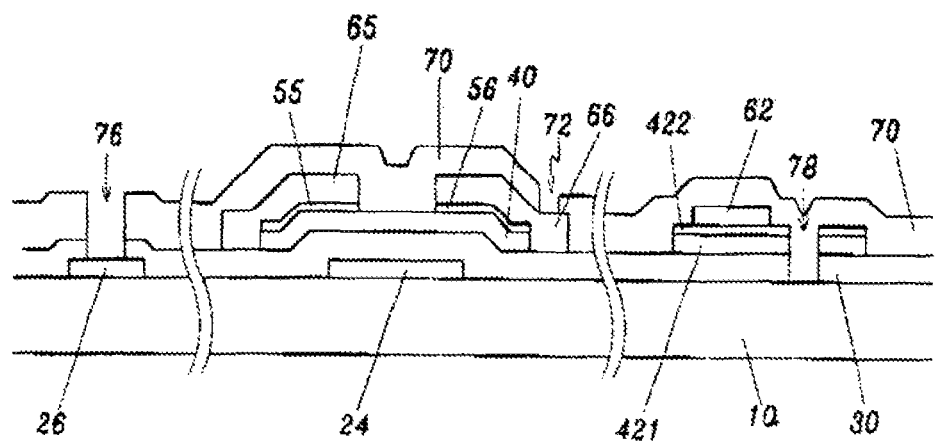

Next, as shown in FIG. 7C, a passivation layer 70 is deposited and patterned to form contact holes 72, 74, and 76, respectively exposing the drain electrode 66, the data pad 64, and the gate pad 26, by etching the passivation layer 70.

Figure 7D:
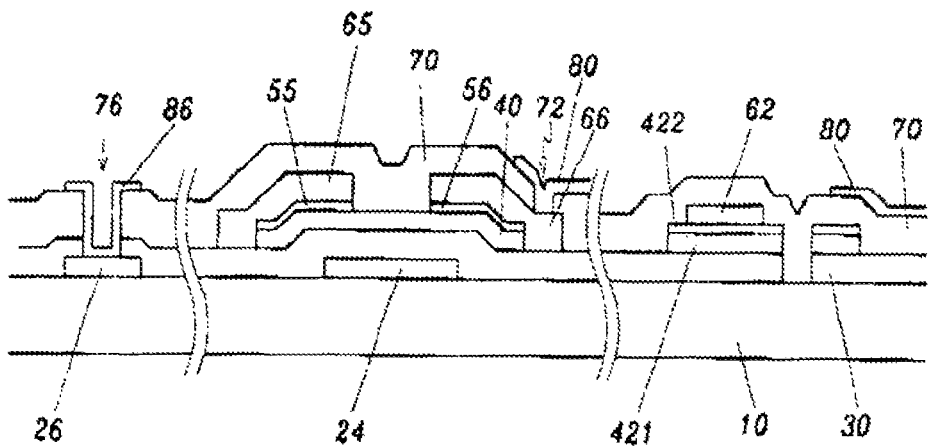

Next, as shown in FIG. 7D, a transparent material is deposited and etched to form the pixel electrode 80, a supplementary gate pad 86 and a supplementary data pad 84. In this step, if ITO remaining material connecting the pixel electrodes 80 of adjacent pixels is left remaining, an additional etch process to remove the remaining material is executed to sever the connections.

Accordingly, in the manufacturing method of the thin film transistor array panel for liquid crystal displays according to the first embodiment, the remaining conductive material 42 is removed along with the passivation layer 70 or the gate insulating layer 30 when forming the opening 78 such that a short defect occurring between the pixel electrode 80 and the data line 62 as a result of the remaining conductive material 42 is prevented.

Of course, if pixel electrode conductive material remains after the step of forming the pixel electrode 80, a photolithography process to form an opening may be added to remove the remaining material. This naturally has the drawback of adding a step, but has the advantage of ensuring complete removal of all remaining conductive material.

A structure of a thin film transistor array panel having a dual-gate line according to a second embodiment of the present invention will now be described with reference to FIGS. 8 and 9.

Figure 8:
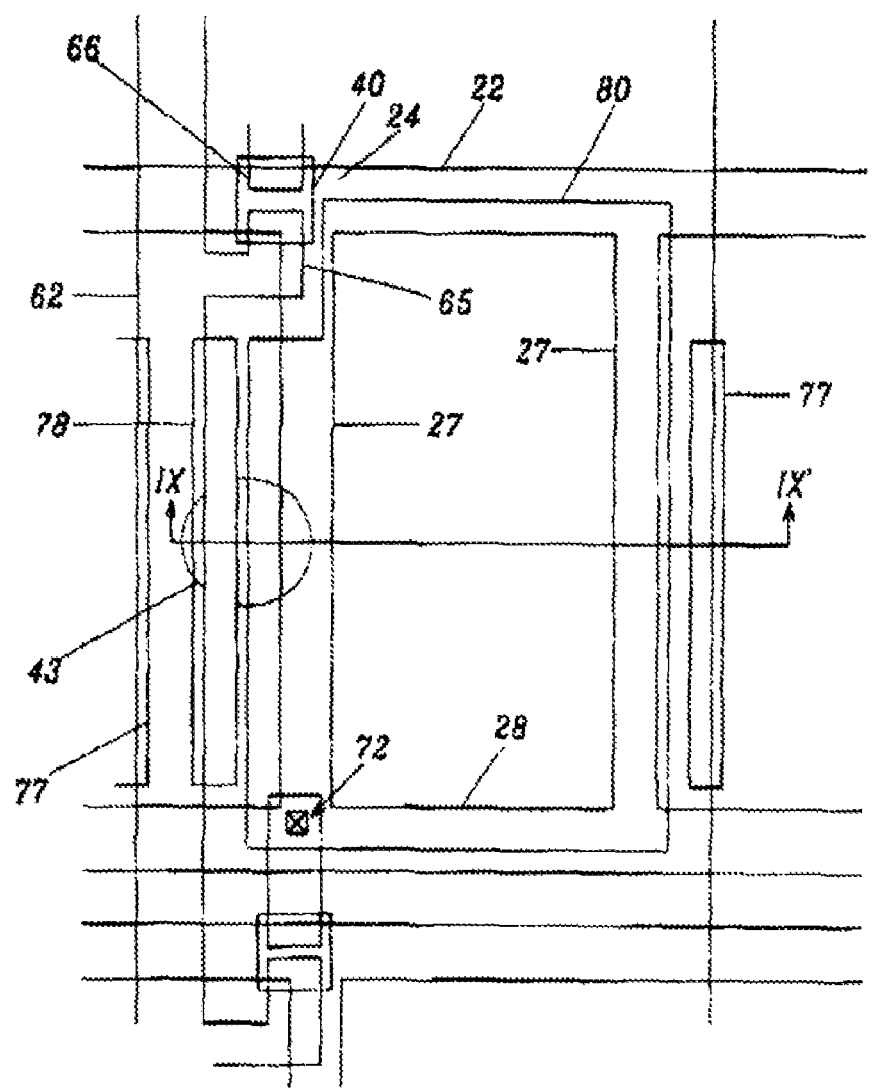
FIG. 8 is a layout view of a thin film transistor array panel for a liquid crystal display having a dual-gate line according to a second embodiment of the present invention.
Figure 9:
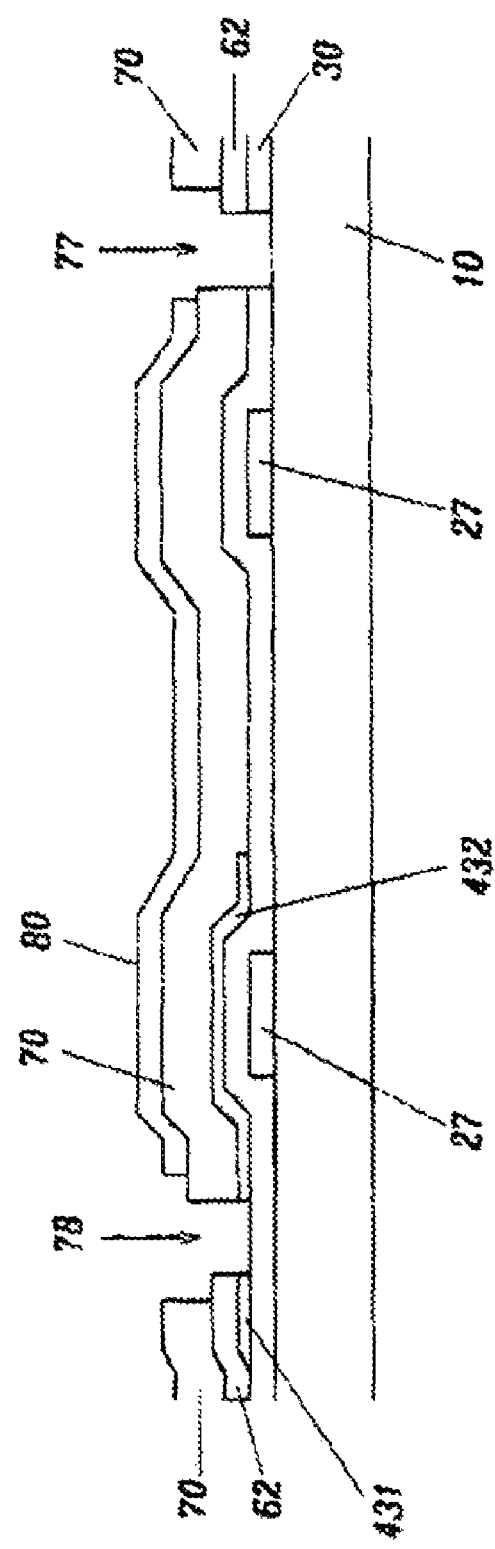
FIG. 9 is a cross-sectional view of a thin film transistor taken along line IX-IX' of FIG. 8.

FIG. 8 is a layout view of a thin film transistor array panel for a liquid-crystal display having a dual-gate line according to the second embodiment of the present invention, and FIG. 9 is a cross-sectional view of a thin film transistor taken along line IX-IX' of FIG. 8. As shown in FIGS. 8 and 9, because openings 77 and 78 in the vertical direction are formed between a data line 62 and a pixel electrode 80 or between the data line 62 and a connection portion 27, remaining conductive material 43, which remains between the data line 62 and the pixel electrode 80, or the pixel electrode 80 and an adjacent pixel electrode, is separated into two portions 431 and 432. That is, because the portion 431, which contacts the data line 62, and the portion 432, which contacts or overlaps the pixel electrode 80, are separated, the image signals applied via the data line 62 distorts a potential voltage of the pixel electrode 80, or are not transmitted to the pixel electrode 80. Accordingly, a point defect in the pixel or between the pixels does not occur.

At this time, as shown in FIG. 9, a structure of the opening 78, in which the passivation layer 70 is removed, and the opening 77, in which the passivation layer 70 and the gate insulating layer 30 are removed, may be adapted.

A structure of a thin film transistor array panel having a pixel electrode located under a data wire according to third and fourth embodiments of the present invention, and a manufacturing method thereof will now be described. First, the present invention according to the third embodiment will be described with reference to FIGS. 10 to 14.

Figure 10:
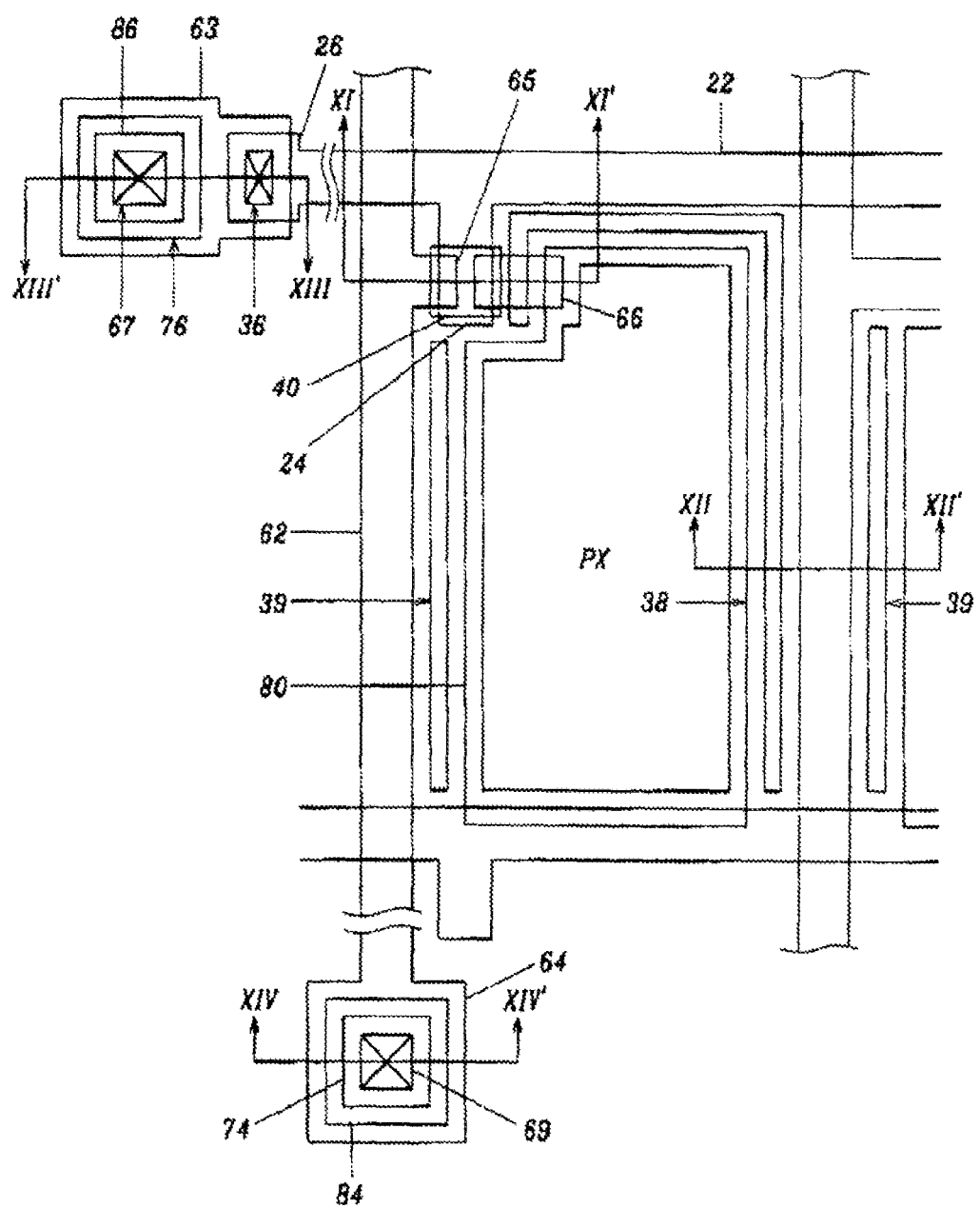
FIG. 10 is a layout view of a thin film transistor array panel for a liquid crystal display according to a third embodiment of the present invention.
Figure 11:
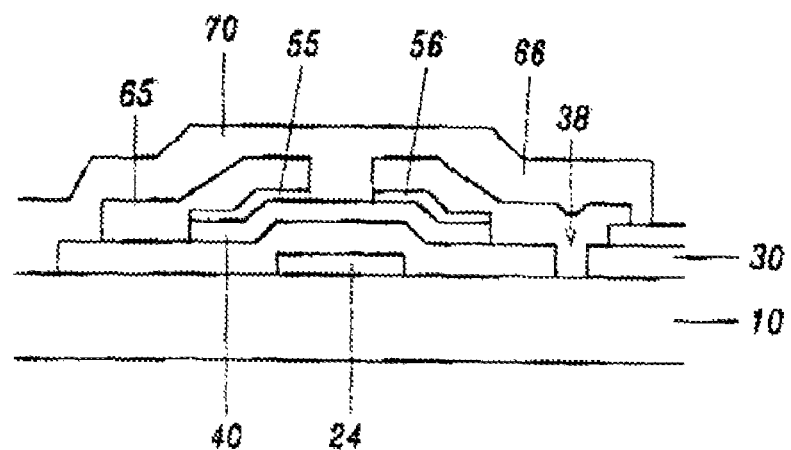
FIG. 11 is a cross-sectional view of a thin film transistor taken along line XI-XI' of FIG. 10.
Figure 12:
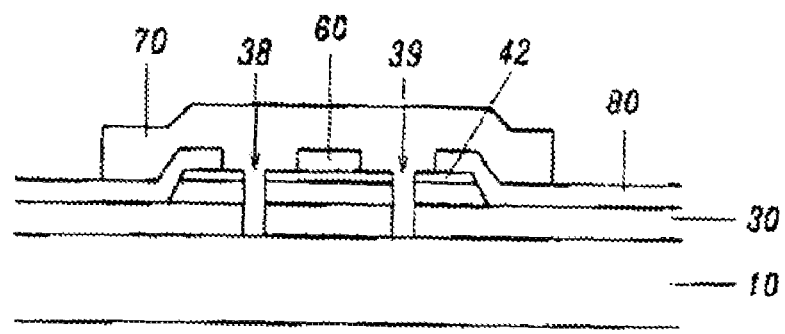
FIG. 12 is a cross-sectional view taken along line XII-XII' of FIG. 10.
Figure 13:
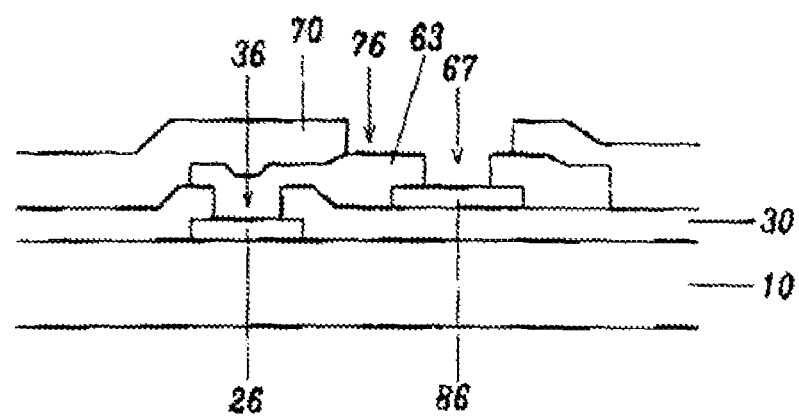
FIG. 13 is a cross-sectional view of a gate pad taken along line XIII-XIII' of FIG. 10.
Figure 14:
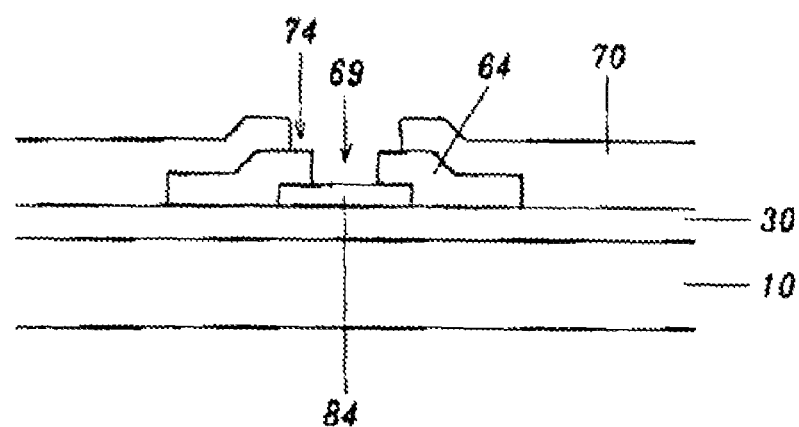
FIG. 14 is a cross-sectional view of a data pad taken along line XIV-XIV' of FIG. 10.

FIG. 10 is a layout view of a thin film transistor array panel for a liquid crystal display according to the third embodiment of the present invention, FIG. 11 is a cross-sectional view of a thin film transistor taken along line XI-XI' of FIG. 10, FIG. 12 is a cross-sectional view taken along line XII-XII' of FIG. 10, FIG. 13 is a cross-sectional view of a gate pad taken along line XIII-XIII' of FIG. 10, and FIG. 14 is a cross-sectional view of a data pad taken along line XIV-XIV' of FIG. 10.

As with the above embodiments, a gate line (or scanning signal line) 22 extending in the horizontal direction, a gate pad 26, and a gate electrode 24 are formed on an insulating substrate 10. A gate insulating layer 30 is formed on the gate wire parts 22, 24, and 26 to cover the same, and has a contact hole 36 exposing the gate pad 26. A semiconductor layer 40 made of hydrogenated amorphous silicon and an ohmic contact layer 55 and 56 made of hydrogenated amorphous silicon doped with Ntype impurities are formed on the insulating substrate 10.

As described in the embodiments above, a pixel electrode 80 is formed on the gate insulating layer 30, and supplementary pad patterns 86 and 84 are respectively formed on a portion adjacent to the gate pad 26 and a portion adjacent to a data pad, which will be formed hereinafter.

Openings 38 and 39, in which the gate insulating layer is removed, are formed along a periphery of the pixel electrode 80. Accordingly, a short defect between adjacent pixel electrodes 80, which occurs as a result of remaining semiconductor material (see 42 in FIG. 12), is prevented.

As in the previously-described embodiments, a data line 62, and source and drain electrodes 65 and 66 are formed on the gate insulating layer 30. At this time, as shown in FIG. 12, the data line 62 is located at the center of the neighboring two openings 38 and 39, and the pixel electrodes 80.

As shown in FIG. 13, a connecting pattern 63, which is connected to the gate pad 26 through the contact hole 36 and is directly connected to the supplementary gate pad 86, is formed adjacent to the gate portion on the same layer as the data wire, and has an opening 67 exposing the center portion of the supplementary gate pad 86.

Furthermore, as shown in FIG. 14 showing a data pad portion, a data pad 64 covers the supplementary data pad 84, and an opening 69 exposing the center portion of the supplementary data pad 84. That is, external signals are applied to the pads 26 and 64 via the supplementary pad pattern 86 and 84. A passivation layer 70 covers the data wire 62, 64, 65, and 66, and the connecting pattern 63. The passivation layer 70 has contact holes 76 and 74 exposing the supplementary pad pattern 86 and 84, respectively, and is removed on the pixel electrode 80.

As described above, because the openings 38 and 39 are formed along the periphery of the pixel electrode 80, the short defect between adjacent pixel electrodes 80, or the data line 62 and the pixel electrode 80 by the remaining semiconductor material 42 does not occur.

A manufacturing method of a thin film transistor array panel for a liquid crystal display according to the third embodiment of the present invention will now be described with reference to the FIGS. 15A to 15F.

FIGS. 15A to 15E are cross-sectional views of manufacturing method of a thin film transistor array panel according to the third embodiment of the present invention.

Figure 15A:
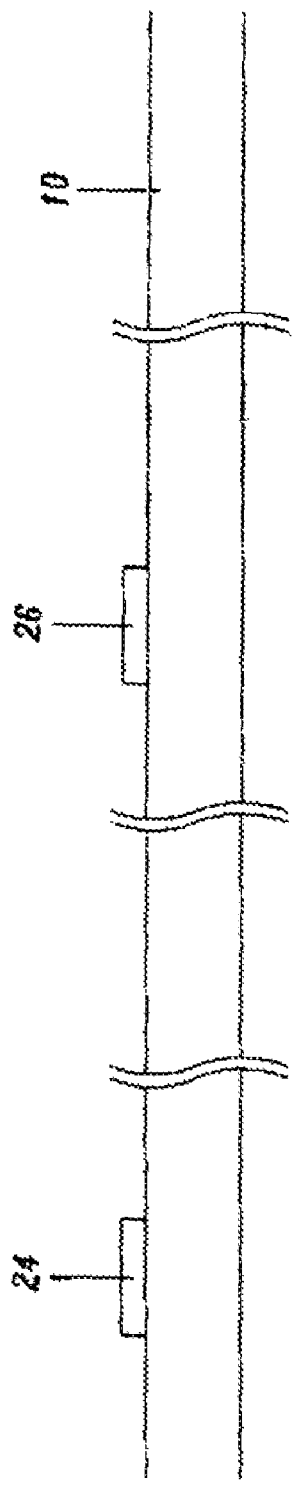
FIGS. 15A to 15F are cross-sectional views of a manufacturing method of a thin film transistor array panel according to the third embodiment of the present invention.

As shown in FIG. 15A, a gate wire including a gate line 22, a gate pad 26, a gate electrode 24 is formed on an insulating substrate 10.

Figure 15B:
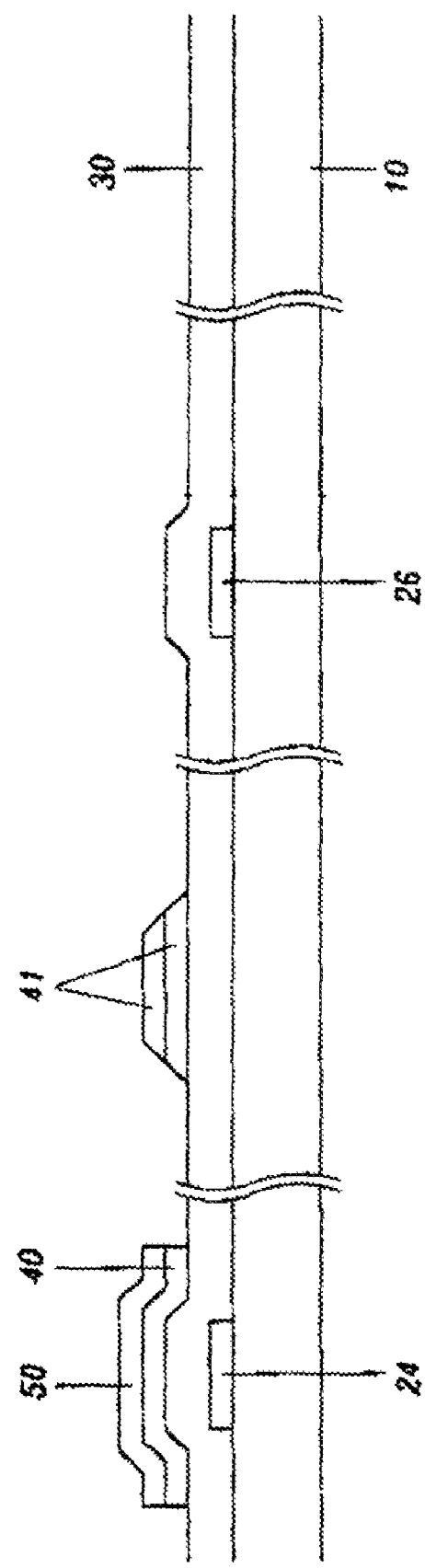

Next, as shown in FIG. 15B, a gate insulating layer 30, amorphous silicon and doped amorphous silicon are sequentially deposited, the amorphous silicon and the doped amorphous silicon being patterned to form a semiconductor layer 40 and the doped amorphous silicon layer 50. In the step of patterning the semiconductor layer 40, a remaining conductive material layer 42 containing a semiconductor may remain on unintended portions, particularly on the portion where a data line 62 and a pixel electrode 80 will be formed.

Figure 15C:
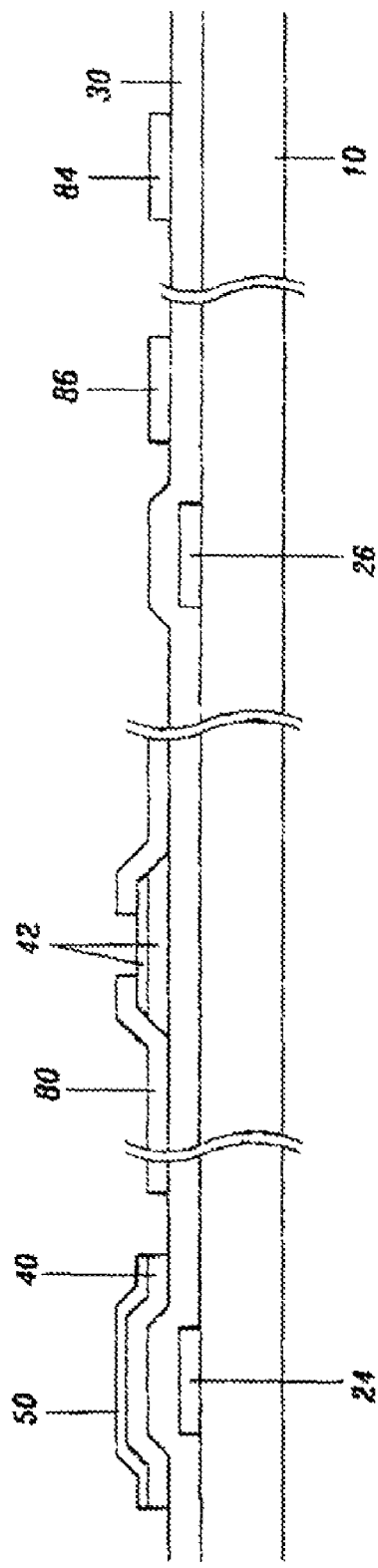

Next, as shown in FIG. 15C, a transparent material such as ITO is deposited and etched to form the pixel electrode 80, and supplementary pad patterns 86 and 84 in gate and data pad portions.

Figure 15D:
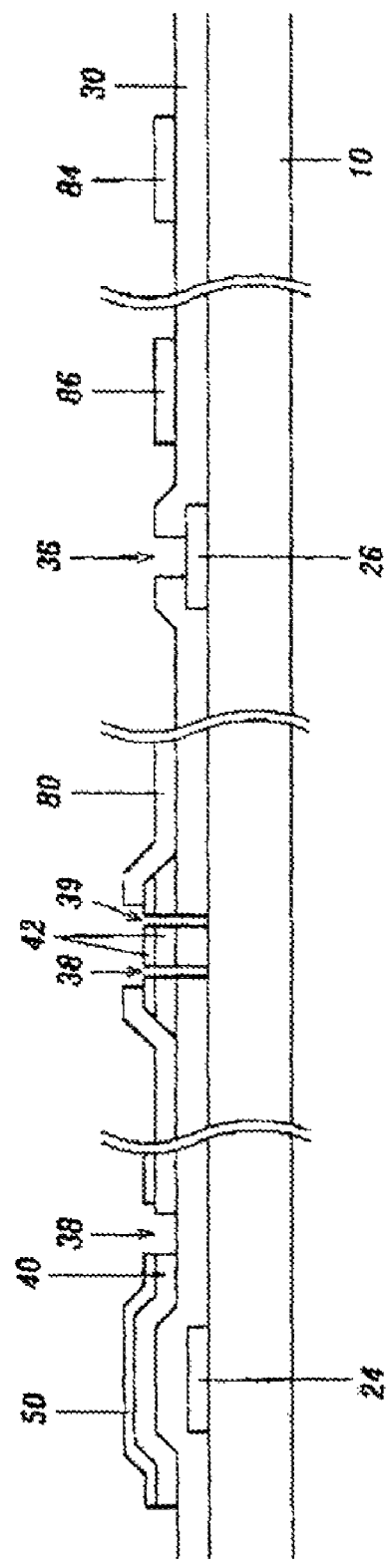

Next, as shown in FIG. 15D, the gate insulating layer 30 is dry-etched to form a contact hole 36 exposing the gate pad 26. In this step, openings 38 and 39 are formed along a periphery of the pixel electrode 80 to remove the gate insulating layer 30 and the remaining conductive material layer 42. In this step, it is desirable that remaining ITO material formed when forming the pixel electrode 80 is removed by using a wet-etch process such that shorts between the pixel electrodes 80 by the remaining ITO material do not occur. Alternatively, in the step of dry etching the gate insulating layer 30 to form the openings 38 and 39, the remaining ITO material may be removed by using a mask to dry etch the remaining ITO material, the mask being the same one used for the pixel electrode 80. As a result, the remaining ITO material and the remaining semiconductor material 42 are simultaneously removed.

Figure 15E:
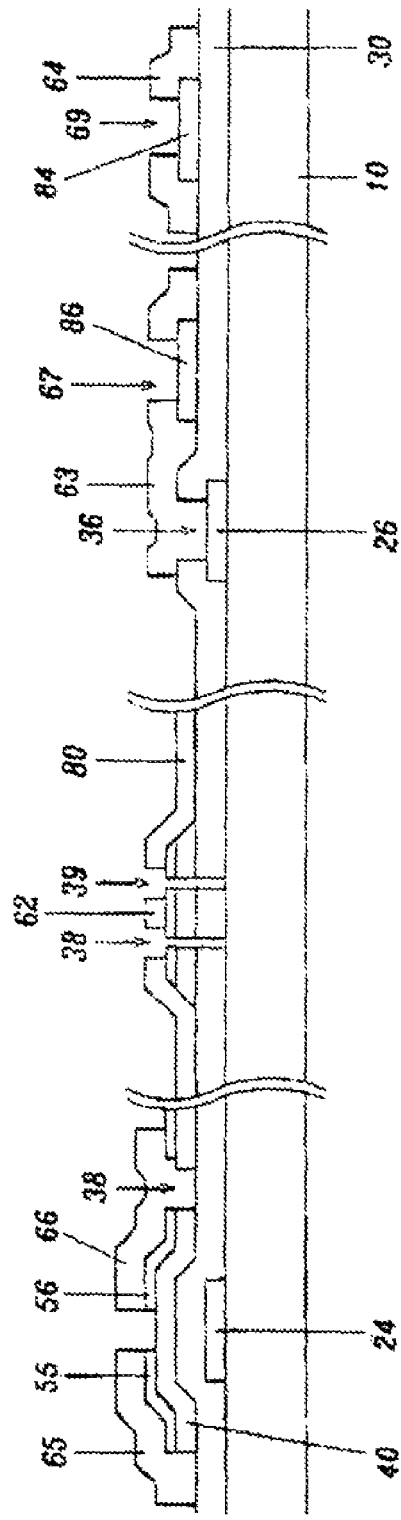

As shown in FIG. 15E, a conductor layer such as data metal is deposited and patterned to form a data line 62, a data pad 64, a source electrode 65, a drain electrode 66, and a connecting pattern 63 in the gate pad portion. Next, the amorphous silicon layer 50, which is not covered by the source and the drain electrodes 65 and 66, is etched to form ohmic contact layers 55 and 56. At this time, the connecting pattern 63 is connected to the gate pad 26 through the contact hole 36. Also at this time, center portions of the connecting pattern 63 and the data pad 64 are etched to form openings 67 and 69 exposing the center portions of the supplementary pad patterns 86 and 84.

Figure 15F:
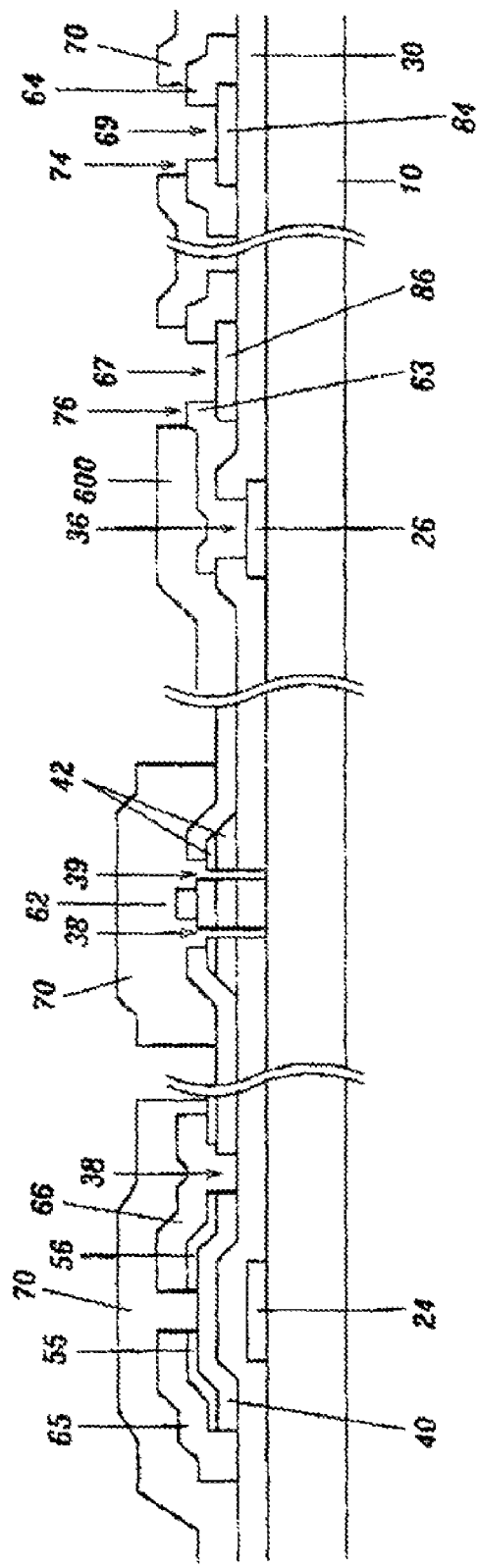

Next, as shown in FIG. 15F, a passivation layer 70 is deposited and patterned to form contact holes 76 and 74 respectively exposing the portions of the supplementary pad patterns 86 and 84 and to expose the pixel electrode 80.

A thin film transistor array panel for a liquid crystal display according to the fourth embodiment of the present invention has a different pad structure from that according to the third embodiment.

A structure and a manufacturing method of a thin film transistor array panel for a liquid crystal display according to the fourth embodiment of the present invention will now be described with reference to FIGS. 16A and 16B, and FIGS. 17A and 17B, respectively.

Figure 16A:
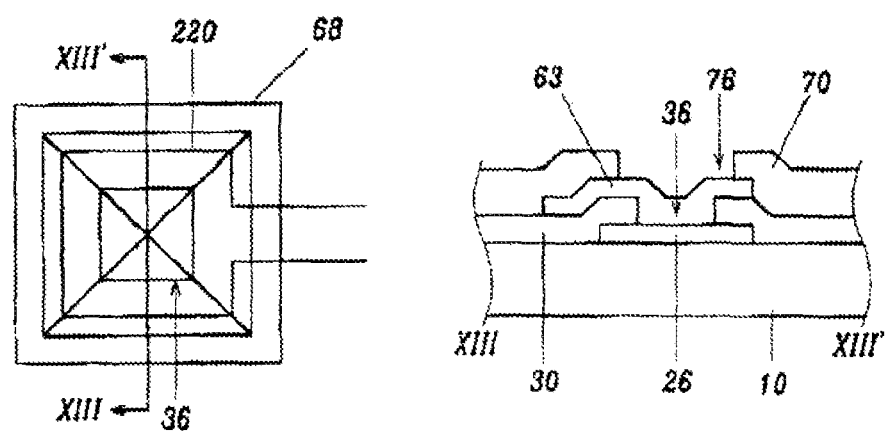
FIG. 16A shows cross-sectional and plane views of a gate pad in a thin film transistor array panel for a liquid crystal display according to a fourth embodiment of the present invention.
Figure 16B:
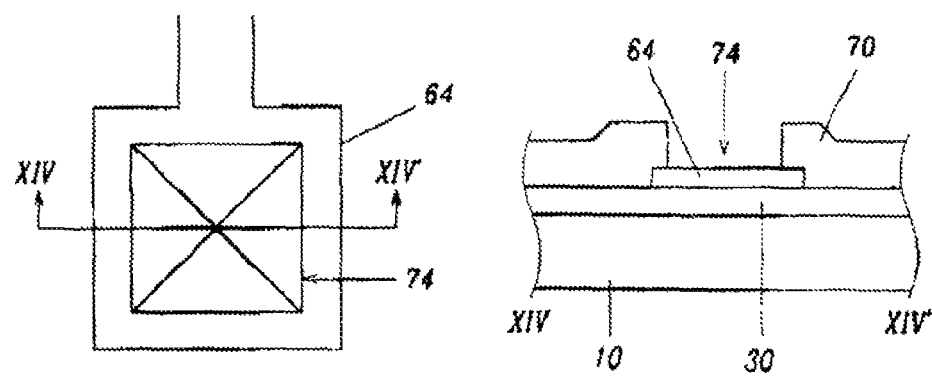
FIG. 16B shows cross-sectional and plane views of a data pad in a thin film transistor array panel for a liquid crystal display according to the fourth embodiment of the present invention.

FIG. 16A shows cross-sectional and plane views of a gate pad in a thin film transistor array panel for a liquid crystal display according to the fourth embodiment of the present invention, and FIG. 16B shows cross-sectional and plane views of a data pad in a thin film transistor array panel for a liquid crystal display according to the fourth embodiment of the present invention.

As shown in FIGS. 16A and 16B, a gate pad 26 is formed on an insulating substrate 10, and a gate insulating layer 30 covers the gate pad 26 and has a contact hole 36 exposing the gate pad 26. A data pad 64 made of chromium (Cr) is formed on the gate insulating layer 30, and a connecting pattern 63 connected to the gate pad 26 through the contact hole 36 is formed using the same material as the data pad 64. A passivation layer 70 covers the data pad 64 and the connecting pattern 63, and has contact holes 76 and 74 exposing the connecting pattern 63 and the data pad 64, respectively. Because chromium is not easily oxidized by air, an ITO supplementary pad pattern as in the third embodiment is not required.

FIGS. 17A to 17D are cross-sectional views of a manufacturing method of a thin film transistor array panel according to the fourth embodiment of the present invention.

Figure 17A:
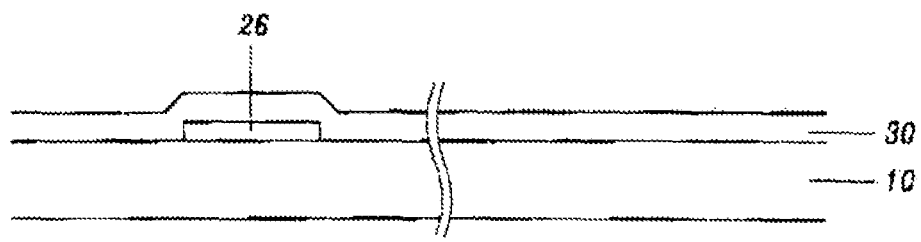
FIGS. 17A to 17D are cross-sectional views of a manufacturing method of a thin film transistor array panel according to the fourth embodiment of the present invention.
Figure 17B:
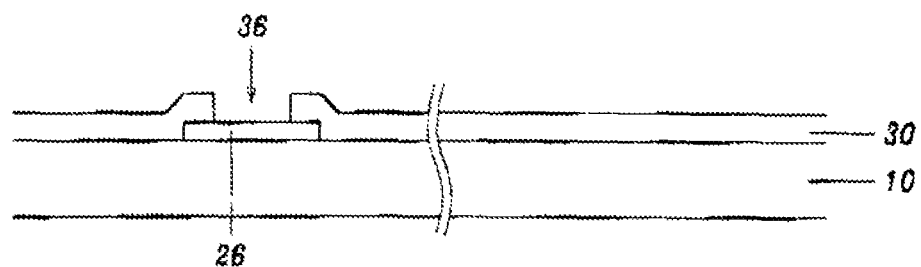

As shown in FIG. 17A, a gate wire including a gate line 22, a gate pad 26, a gate electrode 24 is formed on an insulating substrate 10, and a gate insulating layer 30 is deposited (referring to FIG. 15A) on the gate wire. Next, a semiconductor layer 40, a doped amorphous silicon layer 50, a pixel electrode 80, and openings 38 and 39 are formed in the same manner as in the third embodiment (see FIGS. 15B and 15C). In this step, a contact hole 36 exposing the gate pad 26 is also formed as shown in FIG. 17B.

Figure 17C:
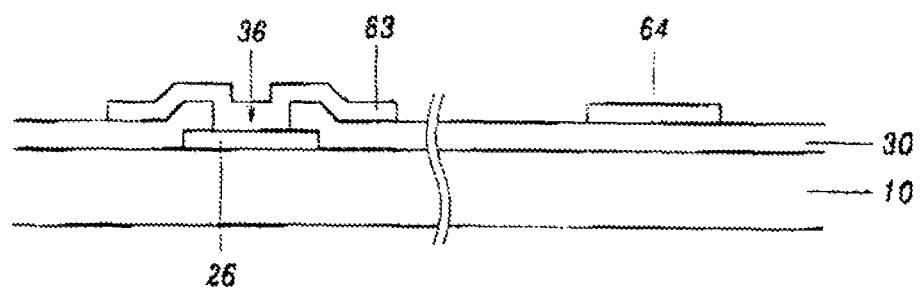
Figure 17D:
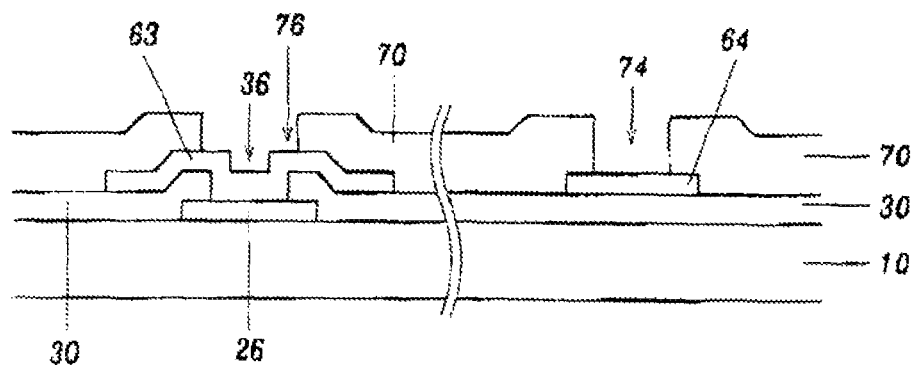

As shown in FIG. 17C, a data line 62, a data pad 64, a source electrode 65, a drain electrode 66, and a connecting pattern 63 in the gate pad portion are formed. At this time, the connecting pattern 63 is connected to the gate pad 26 through the contact hole 36. Next, as shown in FIG. 17D, a passivation layer 70 is deposited and patterned to expose the pixel electrode 80 (see FIG. 15D). At this time, contact holes 76 and 74 respectively exposing the gate pad 26 and the data pad 64 are formed.

As described above, the structure and manufacturing method according the fourth embodiment is the same as the third embodiment except for the gate pad portion and the data pad portion.

The prevention of pixel defects caused by remaining conductive material has been described in the above embodiments. Next, structures which simultaneously minimize pixel defects, stitch defects and misalignment will be described.

First, a structure and principles to minimize misalignment and stitch defects will be described with referring to FIGS. 18 and 19.

Figure 18:
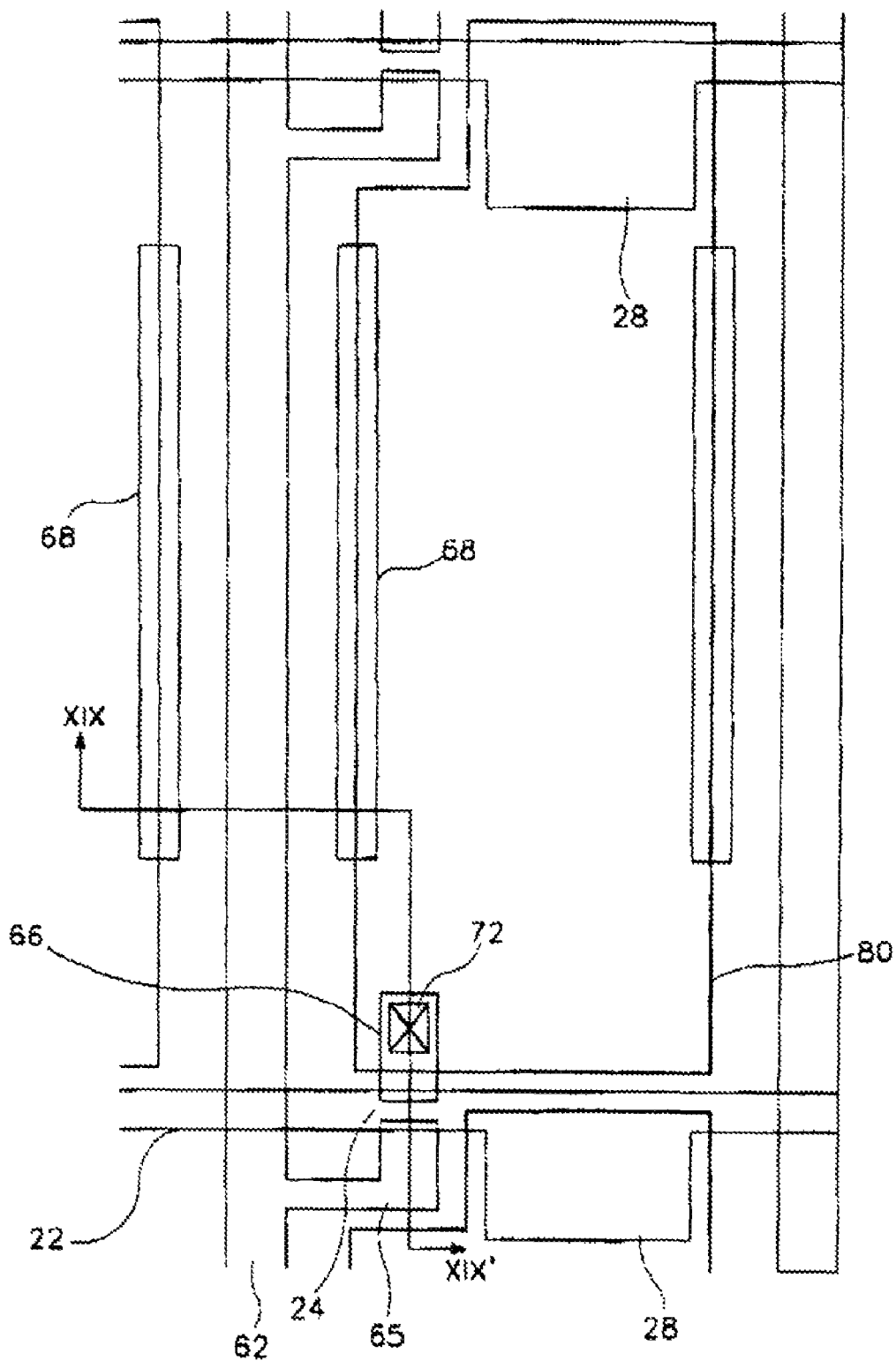
FIG. 18 is a layout view of a thin film transistor array panel for a liquid crystal display according to a fifth embodiment of the present invention.
Figure 19:
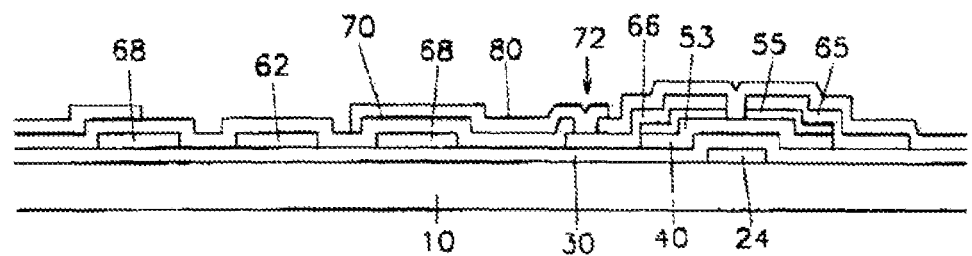
FIG. 19 is a cross-sectional view taken along line XIX-XIX' of FIG. 18.

FIG. 18 is a layout view of a thin film transistor array panel for a liquid crystal display according to a fifth embodiment of the present invention, and FIG. 19 is a cross-sectional view taken along line XIX-XIX' of FIG. 18.

A gate line (or scanning signal line) 22 extending in the horizontal direction is formed on an insulating substrate 10, and a gate insulating layer 30 is deposited thereon. A data line 62 is formed in the longitudinal direction on the gate insulating layer 30, and an align pattern 68, which is separated from the data line 62 and parallel to the data line 62, is formed on both sides of the data line 62. Here, because the align pattern 68 and the data line 62 are formed together, misalignment between the data line 62 and the align pattern 68 does not occur.

A semiconductor layer 40 made of amorphous silicon is formed on the gate insulating layer 30, an ohmic contact layer 55 and 56 made of hydrogenated amorphous silicon and separated from each other with the respect to the gate line 24 are formed thereon, and source and drain electrodes 65 and 66 are formed on the ohmic contact layers 55 and 56. A passivation layer 70 covers the data wire 62, 64, 65, and 66, and the align pattern 68, and a pixel electrode 80 connected to the drain electrode 66 through the contact 72 is formed on the passivation layer 70. The pixel electrode 80 overlaps a portion of the align pattern 68 and is not adjacent to the data line 62.

With such a configuration, a capacitance C1 between the pixel electrode 80 and the data line 62 results in a capacitance connected in series of a capacitance C2 between the pixel electrode 80 and the align pattern 68, and a capacitance C3 between the align pattern 68 and the data line 62. That is, the equation may be: $C1=(C2 \times C3)/(C2+C3)$.

At this time, a distance between the data line 62 and the align pattern 68 is about 3 to 5 μm, a distance between the align pattern 68 and the pixel electrode 80 is about 0.2 μm, and portions of the align pattern 69 and the pixel electrode 80 overlap each other. Accordingly, the capacitance C3 between the align pattern 68 and the data line 62 is very small in comparison with the capacitance C2 between the pixel electrode 80 and the align pattern 68. Here, if the capacitance C3 between the align pattern 68 and the data line 62 is very small in comparison with the capacitance C2 between the pixel electrode 80 and the align pattern 68 in the above equation, the coupling capacitance C1 between the data line 62 and the pixel electrode 80 can be assumed to be very close to equal the capacitance C3 between the align pattern 68 and the data line 62. As a result, the capacitance C3 between the align pattern 68 and the data line 62 determines the coupling capacitance C1 between the data line 62 and the pixel electrode 80. Because misalignment between the data line 62 and the align pattern 68 does not occur, the coupling capacitance between the data line 62 and the pixel electrode 80 is uniform over the entire surface of the substrate 10 such that stitch defects also are not generated.

Figure 21:
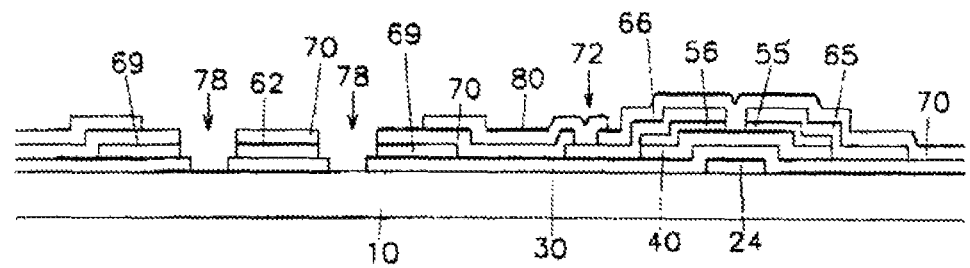
FIG. 21 is a cross-sectional view taken along line XXI-XXI' of FIG. 20.
Figure 20:
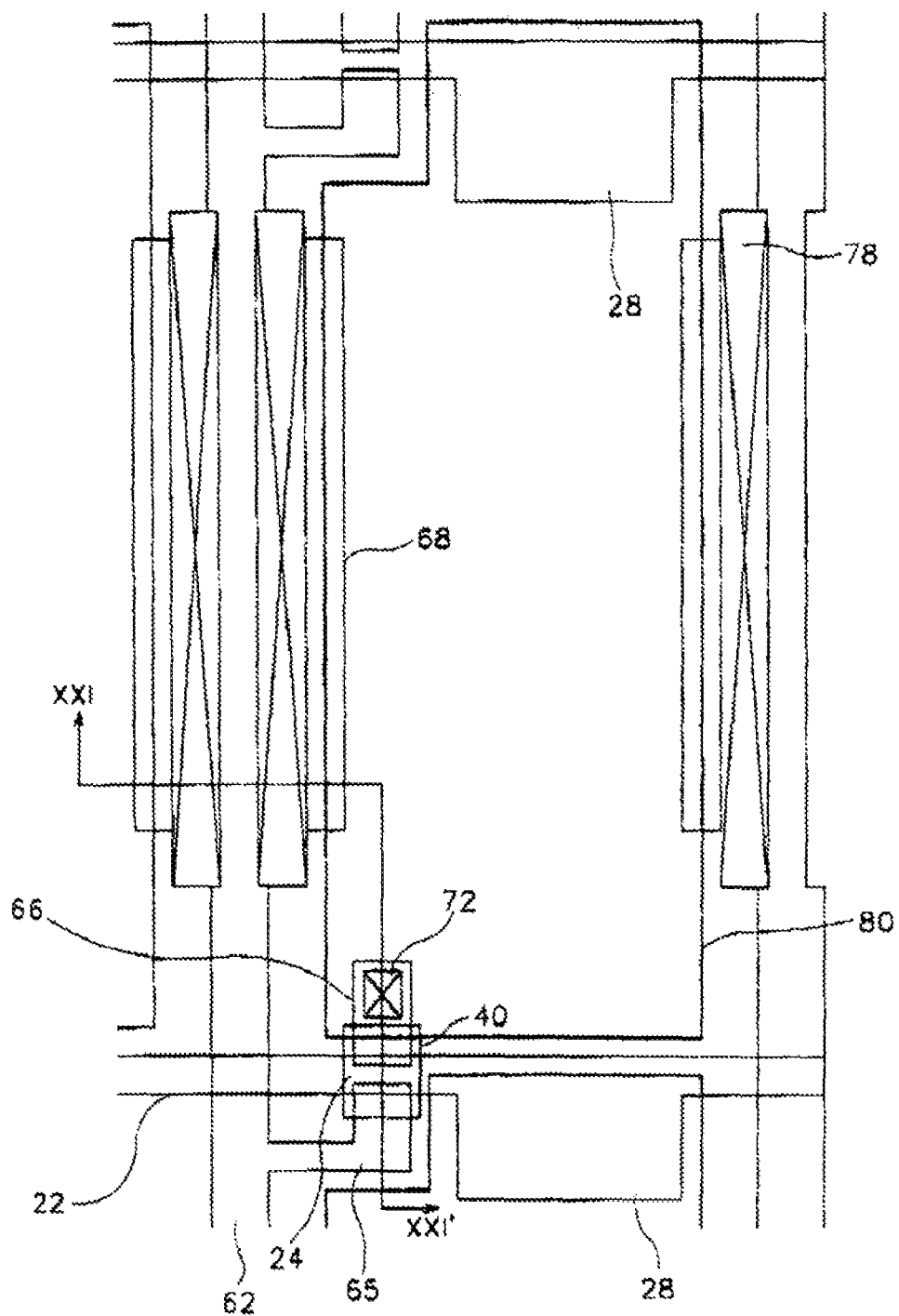
FIG. 20 is a layout view of a thin film transistor array panel for a liquid crystal display according to a sixth embodiment of the present invention.

FIG. 20 is a layout view of a thin film transistor array panel for a liquid crystal display according to a sixth embodiment of the present invention, and FIG. 21 is a cross-sectional view taken along line XXI-XXI' of FIG. 20.

The majority of a structure of the sixth embodiment is the same as that of the fifth embodiment. However, as with the first to fourth embodiments, an opening 78 is formed exposing a substrate 10 by removing a passivation layer 70 and a gate insulating layer 30 between a data line 62 and an align pattern 68.

Here, the opening 78 is formed to enable etching of the data line 62 and the align pattern 68, and a distance between the data line 62 and the align pattern 68 is decided by the opening 78. Accordingly, a uniform coupling capacitance between the data line 62 and the pixel electrode 80 can be ensured. Furthermore, conductive material remaining between the data line 62 and the align pattern 68 or between the data line 62 and the pixel electrode 80 to cause a short between the data line 62 and the align pattern 68 or between the data line 62 and the pixel electrode 80 is prevented by the opening 78, thereby preventing the occurrence of pixel defects.

Figure 23:
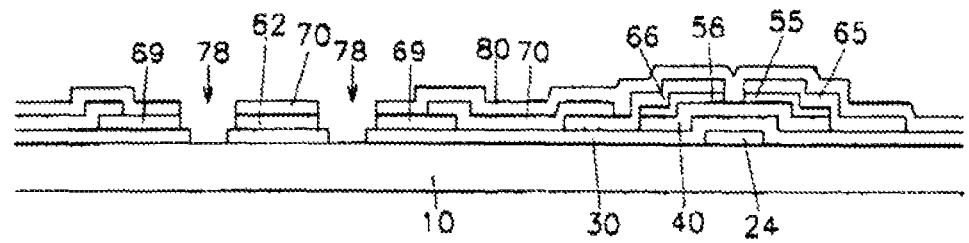
FIG. 23 is a cross-sectional view taken along line XXIII-XXIII' of FIG. 22.
Figure 22:
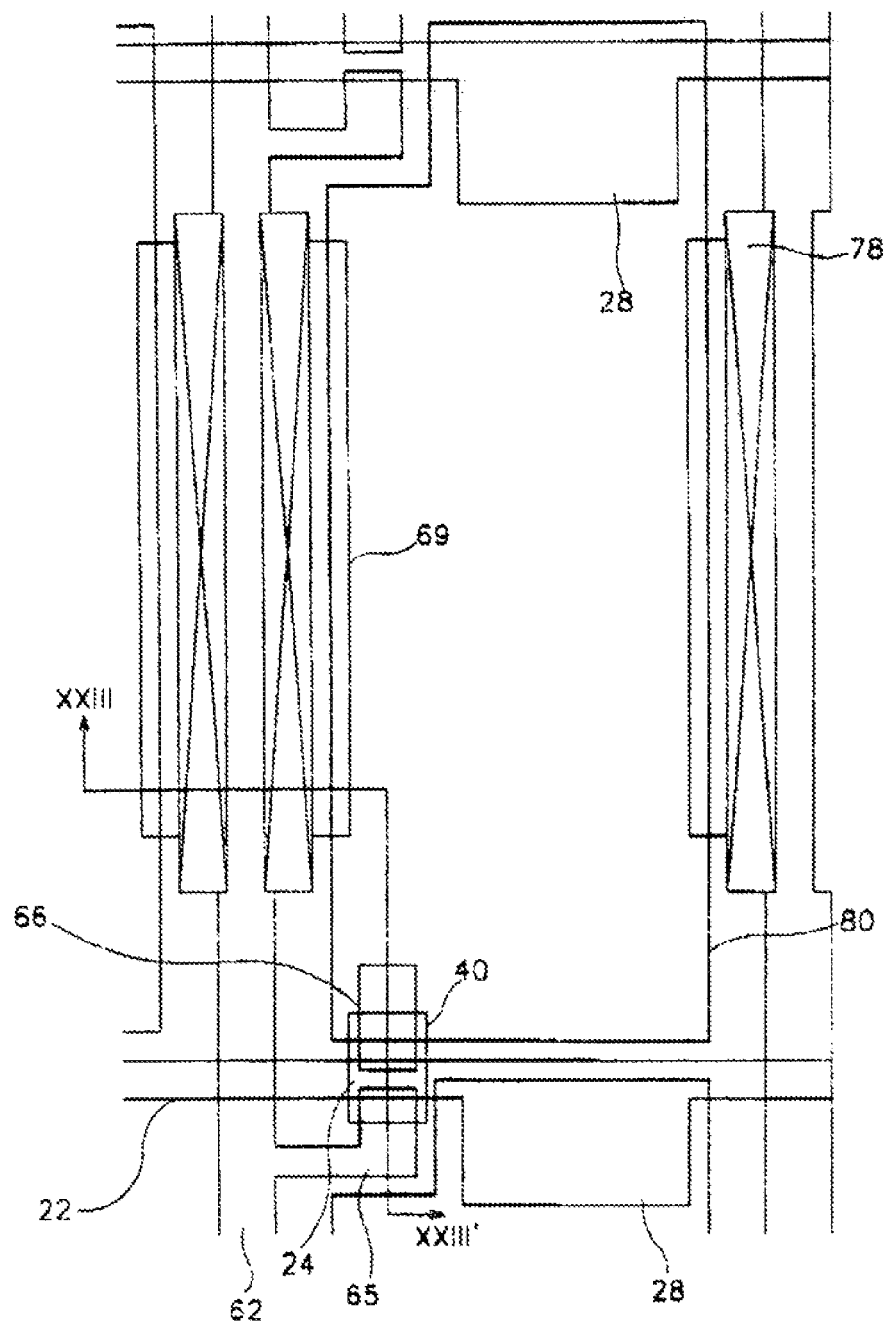
FIG. 22 is a layout view of a thin film transistor array panel for a liquid crystal display according to a seventh embodiment of the present invention.

FIG. 22 is a layout view of a thin film transistor array panel for a liquid crystal display according to a seventh embodiment of the present invention, and FIG. 23 is a cross-sectional view taken along line XXIII-XXIII' of FIG. 22.

A gate line 22, a gate insulating layer 30, an amorphous silicon layer 40, an ohmic contact layer 55 and 56, a data line 62, an align pattern 68, a source electrode 65, and a drain electrode 66 in the seventh embodiment are formed identically as in the sixth embodiment. However, a pixel electrode 80 is formed on a gate insulating layer 30 such that the pixel electrode 80 overlaps a drain electrode 66 and the align pattern 68 to directly contact the drain electrode 66 and the align pattern 68. Also, a passivation layer 70 covers the pixel electrode 80.

With this structure, because a capacitance between the pixel electrode 80 and the align pattern 68 is not generated, the capacitance between the pixel electrode 80 and the data line 62 is the same as the capacitance between the data line 62 and the align pattern 68. Accordingly, the problem of stitch defects is completely prevented. Now, a manufacturing method of a thin film transistor for liquid crystal display according to the sixth and the seventh embodiment will be described with reference to the drawings.

Figure 24A:
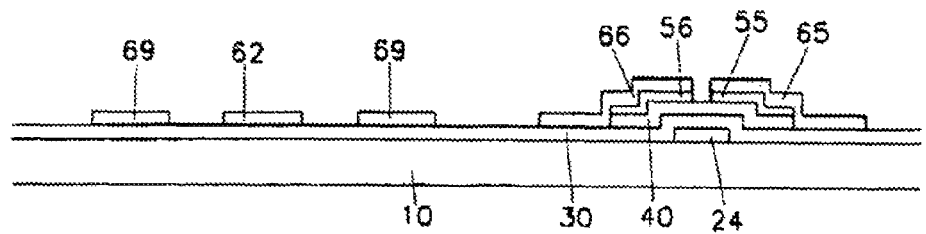
FIGS. 24A to 24B are cross-sectional views of a manufacturing method taken along line XXI-XXI' of FIG. 20.
Figure 24B:
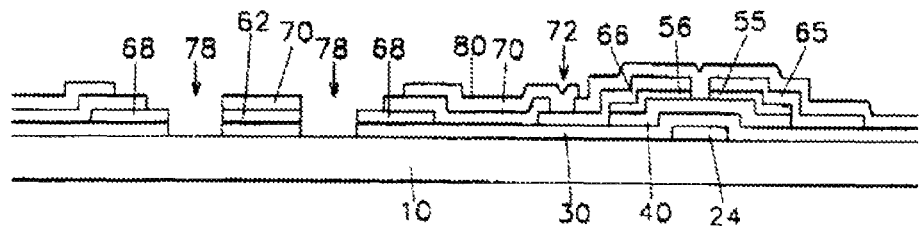

FIGS. 24A to 24B are cross-sectional views of a manufacturing method taken along line XXI-XXI' of FIG. 20.

As shown in FIG. 24A, a gate conductor is deposited on a substrate 10 and patterned to form a gate line 22. A gate insulating layer 30, amorphous silicon and doped amorphous silicon are sequentially deposited, and the amorphous silicon and the doped amorphous silicon are patterned to form a semiconductor layer 40 and a doped amorphous silicon layer which are undivided. Next, a conductor layer such as data metal is deposited and patterned to form a data line 62, a source electrode 65, a drain electrode 66, and an align pattern 68. Next, the amorphous silicon layer, which is not covered by the source and drain electrodes 65 and 66, is etched to form ohmic contact layers 55 and 56.

Figure 25A:
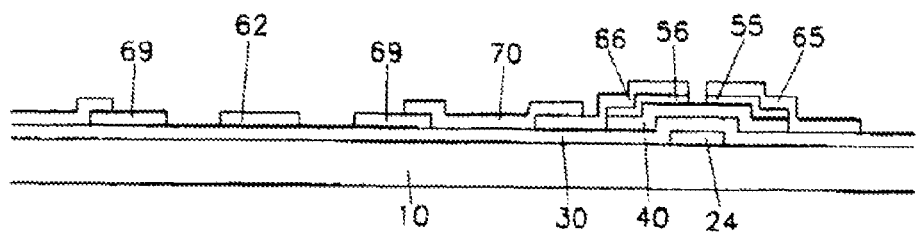
FIGS. 25A to 25B are cross-sectional views of a manufacturing method taken along line XXIII-XIII' of FIG. 22.
Figure 25B:
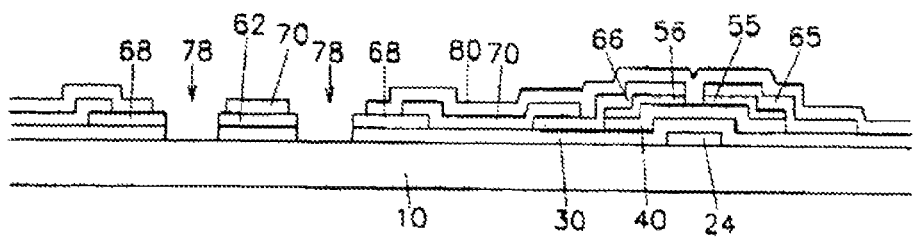

Next, as shown in FIG. 25B, a passivation layer 70 is deposited and patterned to form contact holes 72 exposing the drain electrode 66, and an opening 78 exposing adjacent sides of the date line 62 and the align pattern 68. Subsequently, ITO is deposited and patterned to form a pixel electrode 80. Here, the patterning of the passivation layer 70 is executed by using a dry etch process.

Finally, portions of the data line 62 and the align pattern 68 exposed through the opening 78 are etched by using the passivation layer 70 as a mask. At this time, the gate insulating layer 30 may also be etched.

In this manufacturing method, because a distance between the data line 62 and the align pattern 68 is determined by the opening 78, it is easy to make the distance between the data line 62 and the align pattern 68 uniform. Furthermore, because shorts between the data line 62 and the align pattern 68 or between the data line 62 and the pixel electrode 80 are prevented by the opening 78, pixel defects do not occur.

FIGS. 25A to 25B are cross-sectional views of a manufacturing method taken along line XXIII-XXIII' of FIG. 22.

As shown in FIG. 25A, the manufacturing method according to the seventh embodiment is the same as that of the sixth embodiment through the step of etching an amorphous silicon layer using source and drain electrodes 65 and 66 as a mask. Following this step, ITO is deposited and patterned to form a pixel electrode 80 which overlaps and directly contacts a drain electrode 66 and an align pattern 68.

Next, as shown in FIG. 25B, a passivation layer 70 is deposited and patterned to form an opening 78 exposing adjacent sides of the data line 62 and the align pattern 68. Here, the patterning of the passivation layer 70 is executed using a dry etch process. Finally, portions of the data line 62 and the align pattern 68 exposed through the opening 78 are etched. At this time, remaining conducive material between the data line 62 and the align pattern 68, and the data line 62 and the pixel electrode 80 is removed simultaneously.

Figure 26:
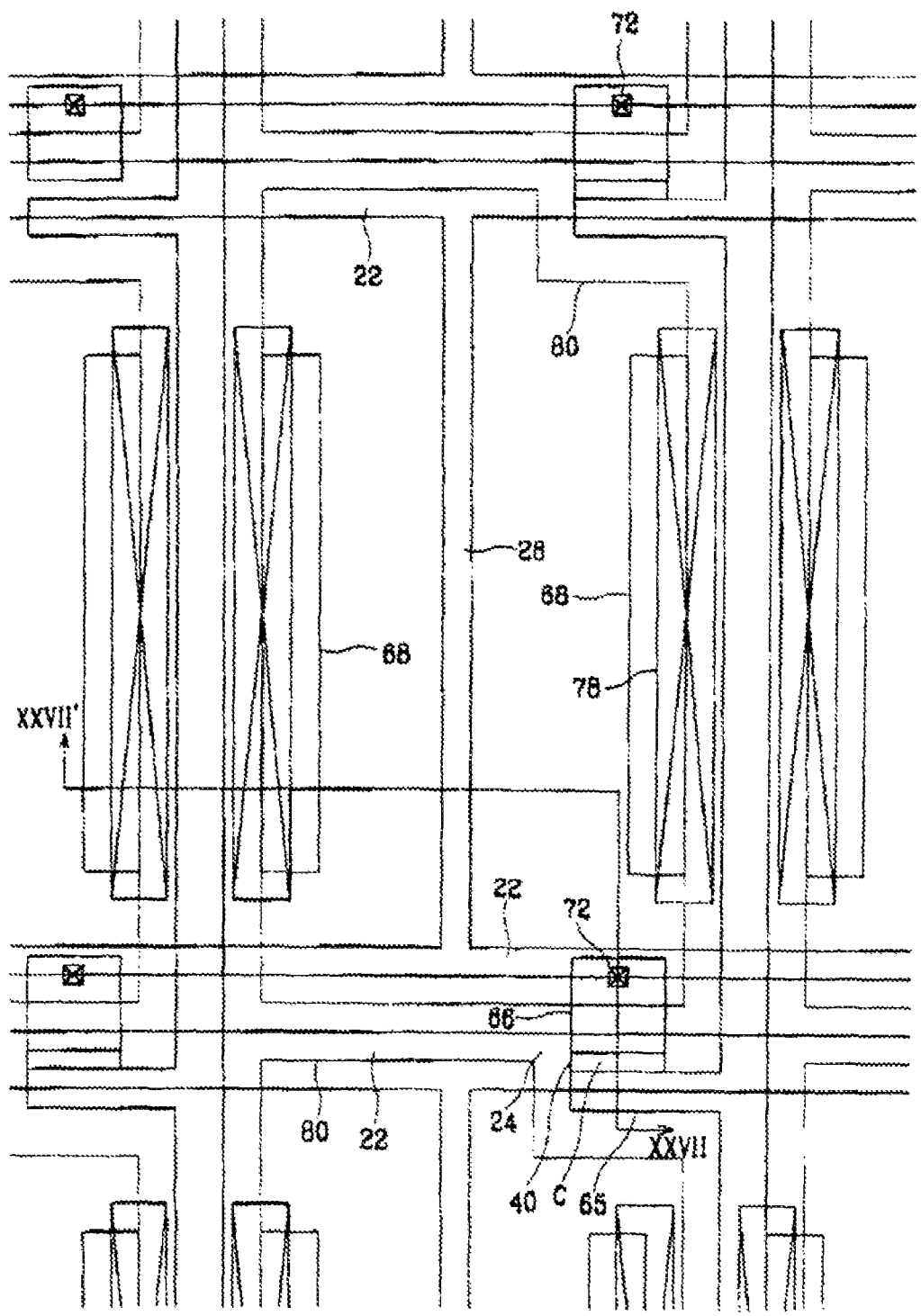
FIG. 26 is a layout view of a thin film transistor array panel for a liquid crystal display according to an eighth embodiment of the present invention.
Figure 27:
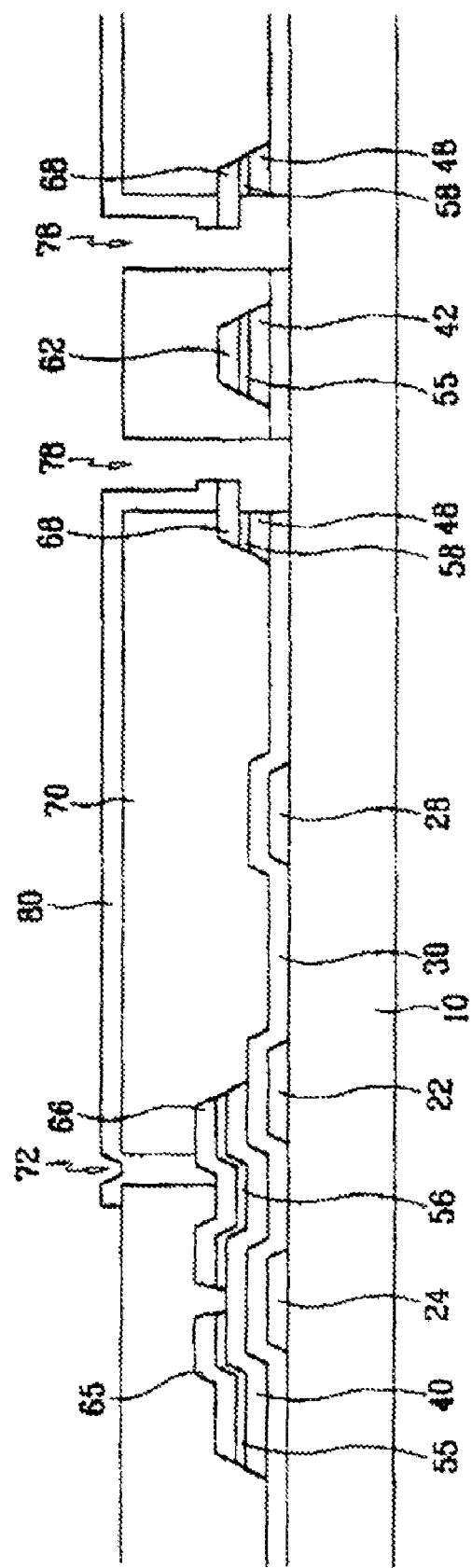
FIG. 27 is a cross-sectional view taken along line XXVII-XXVII' of FIG. 26.

A thin film transistor array panel according to an eighth embodiment of the present invention will now be described with reference to FIGS. 26 and 27. FIG. 26 is a layout view of a thin film transistor array panel for a liquid crystal display according to the eighth embodiment of the present invention, and FIG. 27 is a cross-sectional view taken along line XXVII-XXVII' of FIG. 26.

A gate wire of metal or conductive material such as aluminum (Al) or aluminum alloy, molybdenum (Mo) or molybdenum-tungsten (Mow), chromium (Cr), and tantalum (Ta) are formed on an insulating substrate 10. The gate wire includes a dual gate line (or scanning signal line) 22 extending in the horizontal direction in FIG. 26, a gate electrode 24 which is part of a thin film transistor, and a gate connecting portion 28 which connects the dual gate lines 22 to each other and may include a gate pad (not shown) connected to an end of the gate line 22, the gate connecting portion 28 transmitting a scanning signal from an external circuit to the gate line 22. The gate wire 22, 24, and 28 provides storage capacitance along with a pixel electrode 80 which will be described later. A liquid crystal capacitor includes the pixel electrode 80 and a common electrode (not shown) on an upper panel of the liquid crystal display. A storage wire, which is formed on the same layer as the gate wire and overlaps the pixel electrode 80, may be provided if the storage capacitance between the pixel electrode 80 and the gate wire 22, 24 and 28 is insufficient.

The gate wire parts 22, 24 and 28 may have a multi-layered structure as well as a single-layered structure. When the gate wire parts 22, 24, and 28 form a multi-layered structure, it is preferable that one layer is made of a material having low resistivity and another layer is made of a material having good contacting properties with other materials. Double layers of Cr/Al (or Al alloy) and Al/Mo are such examples.

A gate insulating layer 30 of silicon-nitride (SiNx) is formed on the gate wire parts 22, 24, and 28 and covers the same. A semiconductor pattern 40 and 48 (made of semiconductor such as hydrogenated amorphous silicon) is formed on the gate insulating layer 30. An ohmic contact layer pattern 55, 56, and 58 (made of such materials as amorphous silicon heavily doped with impurities like phosphorus) is formed on the semiconductor pattern 40 and 48.

A data wire and align pattern, which are made of conductive materials such as Mo or MoW, Cr, Al or Al alloy, and Ta, are formed on the ohmic contact layer pattern 55, 56 and 58. The data wire has a data line part including a data line 62 extending in the vertical direction in FIG. 26, and a source electrode 65 of a thin film transistor, which is branched from the data line 62. The data wire also includes a drain electrode 66 of the thin film transistor, which is on an opposite side of the source electrode 65 with respect to the gate electrode 24 or a channel part C of the thin film transistor and separated from the data line parts 62, 65. Further, the date wire may include a data pad (not shown) connected to an end of data line 62 and which transmits image signs from an external circuit to the data line 62. The align pattern 68 is formed in the same direction as the data line 62 on the ohmic contact layer pattern 58.

The data wire parts 62, 65, 66 and 68, and the align pattern 68 may have a multi-layered structure like the gate wire parts 22, 24, and 28. Of course, when the data wire has a multi-layered structure, it is preferable that one layer is made of a material having low resistivity and another is made of a material having good contacting properties with other materials.

The ohmic contact layer pattern 55 and 56 acts to reduce the contact resistance between the semiconductor pattern 40 and the corresponding data wire parts 62, 65, and 66, and has the same layout as the data wire parts 62, 65 and 66. Although the ohmic contact layer portion 58 and the semiconductor pattern 48 are formed under the align pattern 68, a portion of the ohmic contact portion 58 and the semiconductor pattern 48 is formed inwardly from the align pattern 68. The semiconductor pattern 40 except for the channel part C of the thin film transistor, has the same layout as the corresponding data wire parts 62, 65, and 66 and the corresponding ohmic contact layer pattern 55 and 56.

A passivation layer 70 is formed on the data wire parts 62, 65 and 66, the align pattern 68, and the semiconductor pattern 40 which is not covered the data wire. The passivation layer 70 has contact holes 72 exposing the drain electrode 66, and also has (along with the gate insulating layer 30) an opening 78 exposing the substrate 10 between the data line 62 and the align pattern 68 on both sides of the data line 62. Here, because the boundary of the opening 78, which is distanced from the data line 62, is located inside the align pattern 68, the boundary of the align pattern 68 adjacent to the data line 62 is exposed through the opening 78, and the ohmic contact layer portion 58 and the semiconductor pattern 48 under the align pattern 68 adjacent to the data line 62 are formed inwardly from the boundary of the align pattern 68. Of course, the boundary of the opening 78 adjacent to the data line 62 may be located inside the boundary of the data line 62, and the boundary of the opening 78 may be located between the data line 62 and the align pattern 68. In such a case, the passivation layer 70 can have contact holes that expose the gate pad, contact holes that expose the data pad along with the gate insulating layer 30, and be made of an insulating material such as SiNx, acrylic organic material, other transparent photo-definable material, or other organic material.

The pixel electrode 80 which receives an image signal and generates an electric field with a common electrode of an upper panel is formed on the passivation layer 70. The pixel electrode 80 is made of a transparent conductive material such as indium tin oxide (ITO) and indium zinc oxide (IZO). The pixel electrode 80 is connected to the drain electrode 66 both physically and electrically through the contact hole 72, and receives image signals from the drain electrode 66. A portion of the pixel electrode 80 adjacent to the data line 62 is extended on a portion of the align pattern 68 exposed through the opening 78. Of course, the pixel electrode 80 may be only formed on the passivation layer 70, and may be formed beyond the boundary of the align pattern 68. The pixel electrode 80 provides storage capacitance with the gate wire 22, 24 and 28, but a storage wire may be additionally provided to ensure sufficient storage capacitance if the storage capacitance between the pixel electrode 80 and the gate wire 22, 24 and 28 is insufficient. Further, a supplementary gate pad and a supplementary data pad respectively connected to the gate pad and the data pad through the contact holes of the passivation layer 70 may be added. These supplementary pads are optional and act to protect the pads from corrosion due to exposure to external air, and provide additional adhesiveness between an external circuit and the pads.

In this embodiment, transparent ITO or IZO is taken as an example of the material of the pixel electrode 80, but an opaque-conductive material may also be used in a reflective type liquid crystal display.

In this structure according to the present invention, even with the presence of a conductive material in cracks of the passivation layer 80, because the opening 78 is formed between the pixel electrode 80 and the data line 62, shorts between the pixel electrode 80 and the data line 62 do not occur. As a result, pixel defects displaying a "white" state are prevented.

Furthermore, by forming the boundary of the pixel electrode 80 adjacent to the align pattern 68, misalignment occurring in the manufacturing process may be minimized, and stitch defects may be prevented in the case where a stepper is used to expose in units of blocks in the LCD manufacturing process. Also, because the align pattern 68 is located at the boundary of the pixel electrode 80, the align pattern 68 may block the leakage of light in the boundary of the pixel. In addition, the align pattern 68 may be used as a repair line to repair shorts between and occurring in the data line 62 and the gate line 22, or shorts between the data line 62 and the common electrode of the upper substrate. This will be described in more detail with reference to the drawings.

Figure 28:
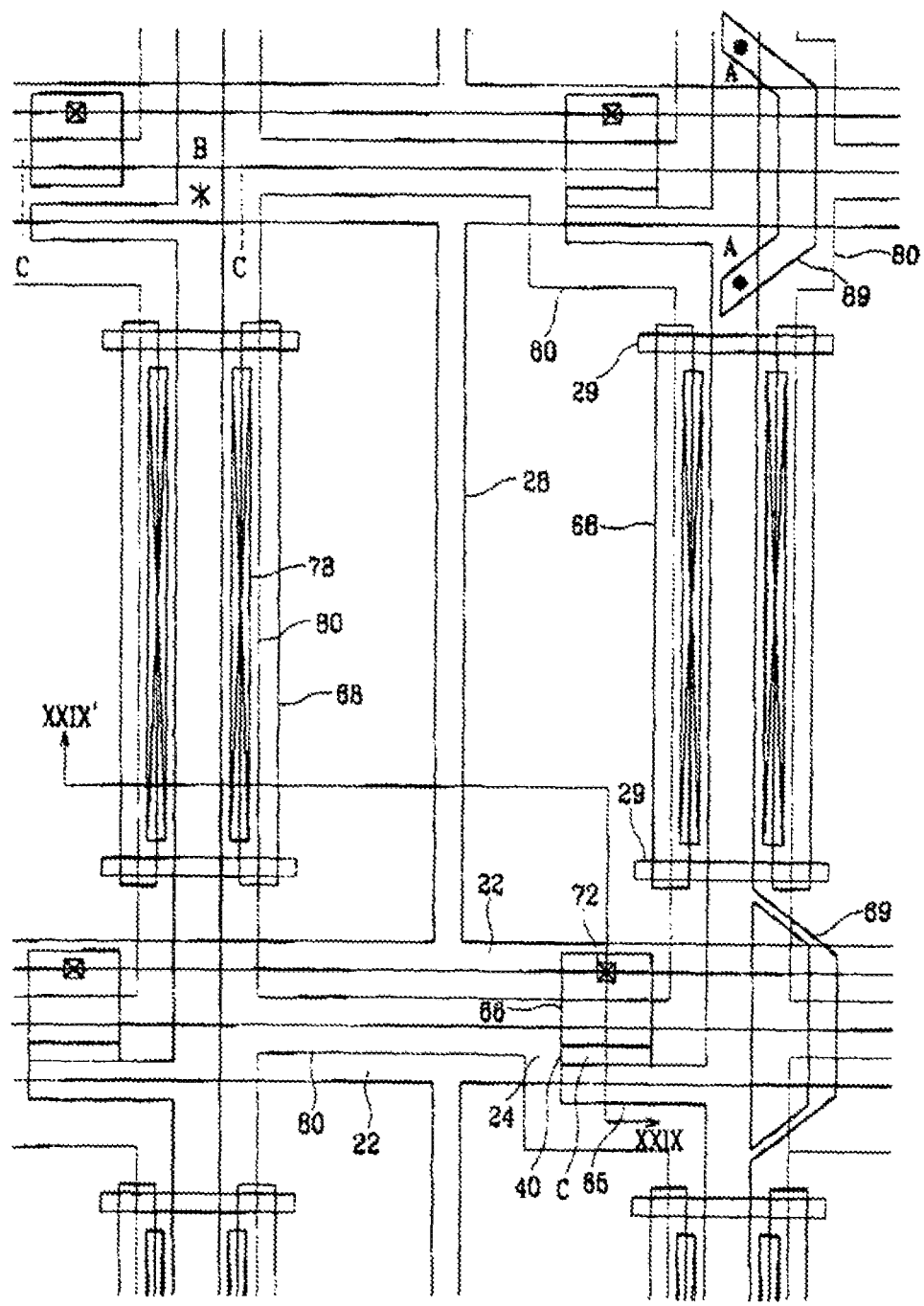
FIG. 28 is a layout view of a thin film transistor array panel for a liquid crystal display according to a ninth embodiment of the present invention.
Figure 29:
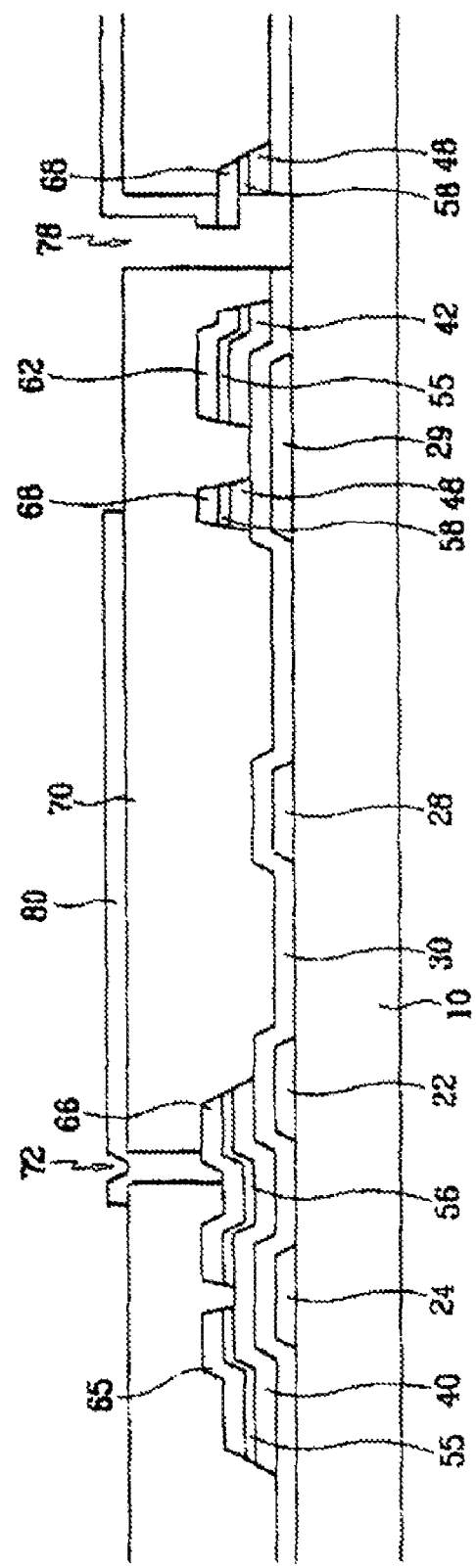
FIG. 29 is a cross-sectional view taken along line XXIX-XXIX' of FIG. 28.

FIG. 28 is a layout view of a thin film transistor array panel for a liquid crystal display according to a ninth embodiment of the present invention, and FIG. 29 is a cross-sectional view taken along line XXIX-XXIX' of FIG. 28.

As shown in FIGS. 28 and 29, the majority of a structure according to the ninth embodiment is similar to that of the eighth embodiment.

However, a repair line 29 both end portions of which respectively overlaps both end portions of an align pattern 68 is formed on a same layer as a gate wire 22, 24 and 26. A pixel electrode 80 is formed only on a passivation layer 70, and is not connected to the align pattern 68. Furthermore, supplementary data lines 69 and 89 are formed on portions crossing a data line 62 and the gate line 22. At this time, the supplementary data line 69 formed on the same layer as the data line 62 is directly connected to the data line 62, and both end portions of the supplementary data line 89 formed on the same layer of the pixel electrode 80 overlap the data line 62. The supplementary data lines 69 and 89 are used to re-route image signals transmitted to the data line 62 in the case where a portion of the data line 62 crossing the gate line 22 becomes severed. If the supplementary data line 89 is used, two portions A (*) of the supplementary data line 89 crossing the data line 62 are connected to the data line 62 by using a laser.

If a short occurs between the data line 62 and the gate line 22 at portion B (*) portion C ( . . . ) of the gate line 22 on both sides of portion B (*) between the gate connecting portions 28 is severed.]

In this structure according to the present invention, because the gate connecting portion 28, which provides storage capacitance by crossing the pixel electrode 80, is located at a center portion of the pixel, it is easy for the pixel electrode 80 to be aligned, the possibility of shorts of the data line 60 and the gate line 22 is small, and it is easy to repair shorts of the data line 60 and the gate line 22.

Next, a method of repairing the data line 62 when it becomes severed will be described with reference to the drawings.

Figure 30:
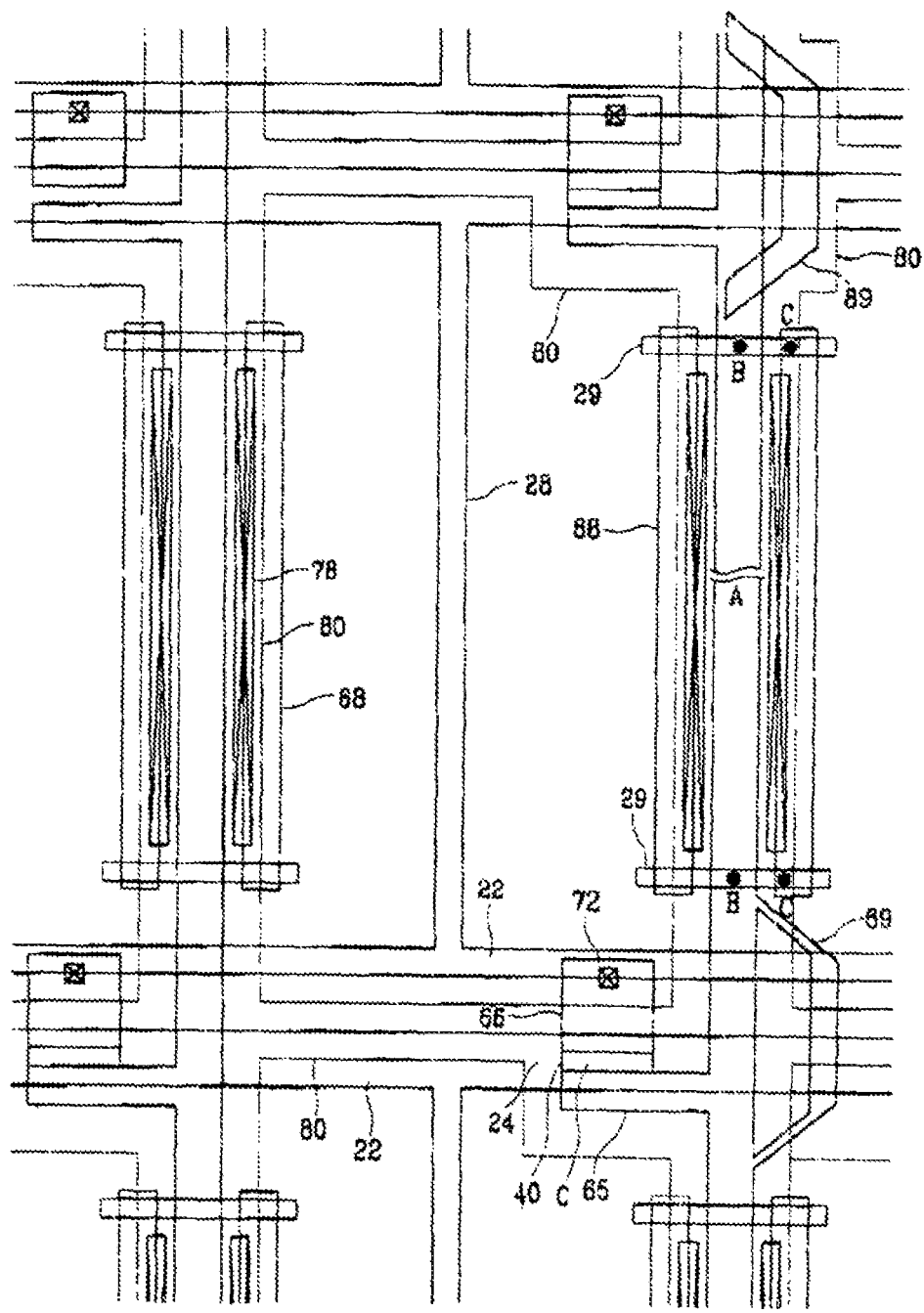
FIG. 30 is a layout view showing a method of repairing a severing of a data line in a thin film transistor array panel for a liquid crystal display according to the ninth embodiment of the present invention.

FIG. 30 is a layout view showing a method of repairing a severed data line in a thin film transistor array panel for a liquid crystal display according to the ninth embodiment of the present invention.

As shown in FIG. 30, if the data line 62 is severed in portion A (~) portions B (*) overlapping the repair line 29 and the data line 62 on both sides of portion A (~) and portions C (*) overlapping both end portions of the align pattern 68 and the repair line 29 are shorted using a laser. Accordingly, image signals transmitted to the severed data line 62 are re-routed through the repair line 29 and the align pattern 68.

Next, a method to repair shorts between the data line 62 and the common electrode (not shown) of the upper substrate will be described with reference to the drawings.

Figure 31:
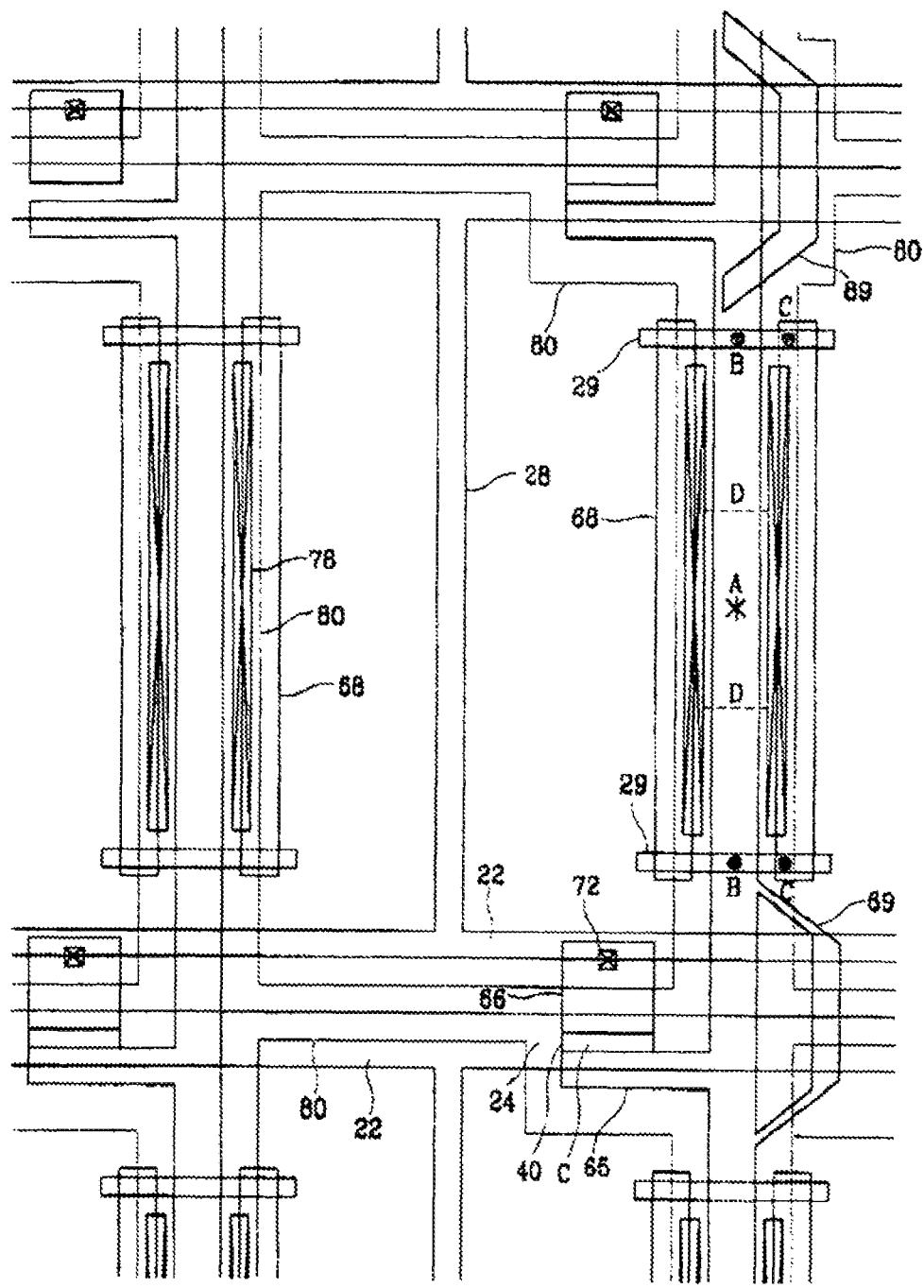
FIG. 31 is a layout view showing a method of repairing a short between a data line and a common electrode in a thin film transistor array panel for a liquid crystal display according to the ninth embodiment of the present invention.

FIG. 31 is a layout view showing a method repairing a short between a data line and a common electrode in a thin film transistor array panel for a liquid crystal display according to the ninth embodiment of the present invention.

As shown in FIG. 31, if the data line 62 and the common electrode (not shown) of the upper substrate is shorted in portion A (*), portions B (*) overlapping the repair line 29 and the data line 62 on both sides of portion A (*) and portions C (*) overlapping both and portions of the align pattern 68 and the repair line 29 are shorted by using laser. Accordingly, image signals of the shorted data line 62 are re-routed through the repair line 29 and the align pattern 68. Also, portions D ( . . . ) of the data line 62 between portion A (*) and portions B (*) of the data line 62 are severed.

A manufacturing method of a thin film transistor array panel according to the eighth embodiment of the present invention will now be described with reference to FIGS. 32A to 32D, and FIGS. 26 and 27. FIGS. 32A to 32D are cross-sectional views of a manufacturing method of a thin film transistor array panel according to the eighth embodiment of the present invention.

Figure 32A:
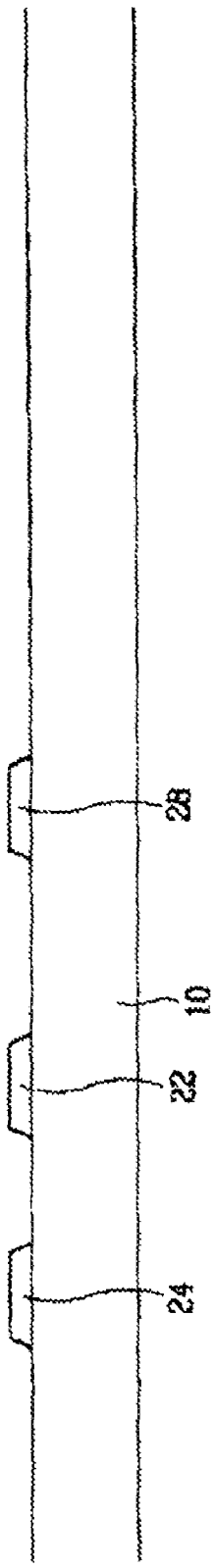

First, as shown in FIG. 32A, a conductive layer 60 such as a metal is deposited on a substrate 10, and a gate wire including a gate line 22, a gate electrode 24, and a gate connecting portion 28 is formed by a photolithography process using a first mask. Here, a gate pad and a repair line 29 (see FIG. 30) may be formed.

Figure 32B:
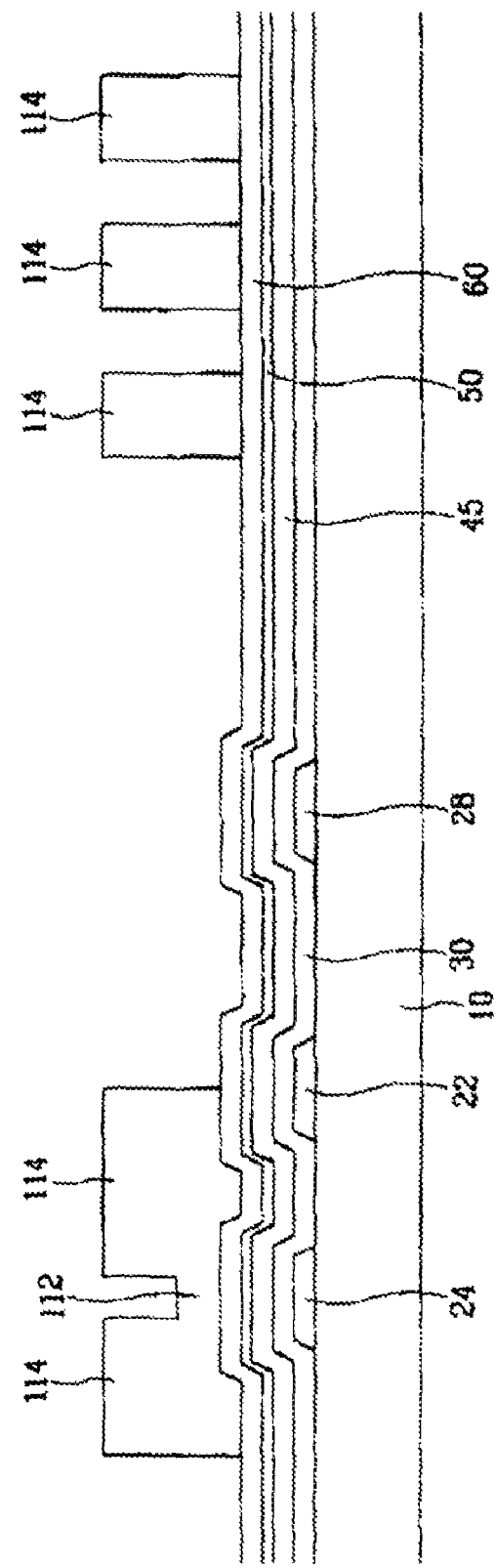

Next, as shown in FIG. 32B, a gate insulating layer 30, a semiconductor layer 45, and an ohmic contact layer 50 are sequentially deposited, then a photoresist layer is coated on the conductive layer 60. The photoresist layer is exposed and developed through photolithography process using a mask having different transmittance depending on position to form first and second photoresist patterns 114 and 112. At this time, the first photoresist pattern 114 located between a source electrode 65 and a drain electrode 66 (i.e., a thin film transistor channel part C) is thinner than the second photoresist pattern 112 located over data wire portion A where a data wire 62, 65 and 66, and an align pattern 68 will be formed. Remaining portions of the photoresist pattern are removed.

There are many methods to vary a thickness of different portions of the photoresist layer. One method controls the amount of incident light by forming a pattern such as a slit or a lattice which is smaller than the resolution of the exposure device, or by providing a partly-transparent layer on the mask. Another method employs reflow.

Next, by using the photoresist pattern 114 and 112, the layers thereunder including the conductive layer 60, the ohmic contact layer 50, and the semiconductor layer 40 are next subjected to an etching process. Here, if the conductive layer 60, the ohmic contact layer 50, and the semiconductor layer 45 are etched by using the photoresist pattern 114 and 112 as an etch mask, the semiconductor pattern 40 and 48 of FIG. 32C may be obtained. Next, the photoresist pattern 112 is removed, and if the conductive layer 60, and the ohmic contact layer 50 are etched by using the photoresist pattern 114 as an etch mask, the data wire 62, 65 and 66, the align pattern 68, and the ohmic contact layer pattern 55, 56 and 58 of FIG. 32C may be obtained. Here, a supplementary data line 69 and a data pad may be formed, and the semiconductor pattern 40 and 48 are extended outside the data wire 62, 65 and 66, and the align pattern 68.

After forming the data wire parts 62, 65, 66, and the align pattern 68 by the above steps, a passivation layer 70 is formed by CVD of SiNx or by spin coating an organic insulator, as shown in FIG. 32D. Next, a contact hole 72 exposing the drain electrode 66 and an opening 78 exposing the substrate 10 between the data line 62 and the align pattern are formed. At this time, it is preferable that the contact layer pattern 58, the semiconductor pattern 48 and the gate insulating layer 30 are etched in the opening 78 to under the align pattern 68 such that an under cut is generated. Here, contact holes exposing the gate pad and the data pad may be formed.

Next, as shown in FIGS. 26 to 27, an ITO layer is deposited and etched using the mask to form a pixel electrode 80. At this time, a supplementary data line 89 of FIG. 28, and a supplementary gate pad and a supplementary data pad connecting the contact holes may be formed. Here, it is preferable that a distance between the data line 62 and a boundary of the pixel electrode 80 adjacent to the data line 62 is equal to or greater than a distance between the data line 52 and a boundary of the align pattern adjacent to the data line 62. As described above, the pixel electrode 80 may be connected to the align pattern 68, and may only overlap a portion of the align pattern 68.

In the manufacturing method according to the present invention, though remaining conductive material is remained when forming the semiconductor pattern 40 and 48, and the data wire 62, 65 and 66, because the opening 78 of the passivation layer 70 is formed thereafter, shorts between the semiconductor pattern 40 and the data wire 62, 65, 66, and the semiconductor pattern 48 and the align pattern a are not generated. Furthermore, even with the presence of ITO material in the cracks of the passivation layer 70 when forming the pixel electrode 80, because the portion under the align pattern 68 is under-cut, shorts between the pixel electrode 80 and the data line 62 do not occur.

By the present invention, misalignment in the manufacturing process of a thin film transistor panel for a liquid crystal display is minimized by forming the align pattern adjacent to the pixel electrode when forming the data line. Stitch defects are prevented by uniformly forming the coupling capacitance between the data line and the pixel electrode in the case of using a block exposure device. Furthermore, the leakage of light is prevented by forming the align pattern on the circumference of the pixel, and shorts between the data line and the pixel electrode are prevented by forming the opening between the data line and the pixel electrode.

In the drawings and specification, there have been disclosed typical preferred embodiments of the present invention and, although specific terms are employed, they are used in a generic and descriptive sense only and not for purposes of limitation, the scope of the invention being set forth in the following claims.

We claim:

1. A thin film transistor array panel, comprising:
   an insulating substrate;
   a gate line disposed on the insulating substrate;
   a data wire comprising a drain electrode and a data line disposed on the gate insulating layer and crossing the gate line;
   a passivation layer covering the gate line and the data line and
   a pixel electrode disposed on the passivation layer;
   wherein the gate insulating layer has a first opening, and the passivation layer has a second opening and a contact hole, the first opening and the second opening being disposed over a first area of the insulating substrate and the contact hole being disposed over a second area of the insulating substrate that is different from the first area of the insulating substrate,
   wherein the second opening exposes the first opening,
   wherein the first opening and the second opening are located in an area ranging from an edge of the pixel electrode to an edge of the gate line or the data line adjacent to the edge of the pixel electrode, and
   wherein the contact hole exposes a portion of the drain electrode.

2. The thin film transistor array panel of claim 1, further comprising a pixel electrode disposed on the passivation layer.

3. The thin film transistor array panel of claim 2, wherein the pixel electrode has a third opening disposed over the first area of the insulating substrate so as to be aligned with the first opening and the second opening.

4. The thin film transistor array panel of claim 3, wherein at least one of the first opening and the second opening further includes an under-cut portion disposed under the pixel electrode.

5. The thin film transistor array panel of claim 1, wherein the first opening exposes the insulating substrate.

6. The thin film transistor array panel of claim 1, wherein at least one portion of the second opening is located between the data line and the pixel electrode.

7. The thin film transistor array panel of claim 6, further comprising an align pattern, wherein at least one portion of the second opening is located between the data line and the align pattern.

8. The thin film transistor array panel of claim 7, wherein at least one portion of the second opening is located between the gate line and the pixel electrode.

9. The thin film transistor array panel of claim 6, wherein at least one portion of the second opening is located between the gate line and the pixel electrode.

10. The thin film transistor array panel of claim 1, further comprising an align pattern, wherein at least one portion of the second opening is located between the data line and the align pattern.

11. The thin film transistor array panel of claim 1, wherein at least one portion of the second opening is located between the gate line and the pixel electrode.

12. The thin film transistor array panel of claim 1, wherein the first opening and the second opening overlap each other, and
wherein the overlapping portion of the first opening and the second opening overlaps at least one portion of the pixel electrode.

13. The thin film transistor array panel of claim 1, wherein the first opening and the second opening have substantially the same area.

14. The thin film transistor array panel of claim 1, further comprising:
 a semiconductor pattern disposed on the gate insulating layer; and
 a source electrode disposed on the semiconductor pattern and opposite to the drain electrode.

* * * * *